US008835974B2

(12) United States Patent
Nagumo

(10) Patent No.: US 8,835,974 B2
(45) Date of Patent: Sep. 16, 2014

(54) DRIVING DEVICE, PRINT HEAD AND IMAGE FORMING DEVICE

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 330 days.

(21) Appl. No.: 13/166,055

(22) Filed: Jun. 22, 2011

(65) Prior Publication Data

US 2012/0001996 A1 Jan. 5, 2012

(30) Foreign Application Priority Data

Jun. 30, 2010 (JP) ................................ 2010-149797

(51) Int. Cl.

*H01L 29/74* (2006.01)
*B41J 2/435* (2006.01)
*B41J 2/47* (2006.01)
*B41J 2/45* (2006.01)
*G03G 15/04* (2006.01)

(52) U.S. Cl.

CPC ............. *B41J 2/45* (2013.01); *G03G 15/04054* (2013.01)
USPC ........... 257/107; 347/224; 347/237; 347/238; 347/247

(58) Field of Classification Search

USPC ................... 257/107; 347/224, 237, 238, 247
See application file for complete search history.

(56) References Cited

U.S. PATENT DOCUMENTS 6,531,826 B1 * 3/2003 Ohno et al. ................ 315/169.3
7,286,259 B2 * 10/2007 Ohno et al. .................... 358/1.8

FOREIGN PATENT DOCUMENTS

JP 2004195796 A * 7/2004
JP A-2004-195796 7/2004

* cited by examiner

*Primary Examiner* — Sarah Al Hashimi

(74) *Attorney, Agent, or Firm* — Muncy, Geissler, Olds & Lowe, P.C.

(57) ABSTRACT

A driving device that drives a light emitting thyristor array includes: a first driving circuit operated by a second power source; a scanning circuit including plural stages of scanning thyristors and sequentially scanning the plural stages of light emitting thyristors, a second driving circuit operated by a second power source, generating first and second clock signals for driving the scanning circuit, and outputting the first and second clock signals from first and second clock terminals, respectively, a terminal of an odd numbered stage scanning thyristor is commonly connected to the first clock terminal, another terminal of an even numbered stage scanning thyristor is commonly connected to the second clock terminal, and a control terminal of a first stage scanning thyristor is connected to the second clock terminal via a first resistor.

13 Claims, 14 Drawing Sheets

DRIVING DEVICE, PRINT HEAD AND IMAGE FORMING DEVICE

CROSS REFERENCE TO RELATED APPLICATION

The present application is related to, claims priority from and incorporates by reference Japanese Patent Application No. 2010-149797, filed on Jun. 30, 2010.

TECHNOLOGY FIELD

The present embodiments relate to a driving device that drives a plurality of light emitting thyristor arrays formed from a plurality of light emitting thyristors, a print head that includes the driving device, and an image forming device.

There are image forming devices, such as electrographic printers, in which an exposure part is configured from a plurality of light emitting thyristors arrayed as light emitting elements. In such image forming devices using the light emitting thyristors, a driving circuit and the light emitting thyristors are provided at a ratio of 1:N (N>1). Positions of the light emitting thyristors to be driven are designated by using the gates of the light emitting thyristors. Light emission power is controlled by a value of current that flows between the anodes and cathodes of the respective light emitting thyristors.

So-called self scanning print heads are known as print heads that use the light emitting thyristors. When driving a conventional self scanning print head under a power source voltage of 3.3 V, gate trigger current cannot be generated with the 3.3 V for the power source voltage. To compensate for this, a configuration is known in which an undershoot voltage is generated in a transfer clock signal waveform (hereinafter "clock signal" is simply referred to as "clock"), and in which the gate trigger current is generated with an added value of the undershoot voltage and 3.3 V for the power source voltage.

For example, according to the technique disclosed in Japanese Laid-Open Patent Application Publication No. 2004-195796, in order to generate the transfer clock waveform, a first output terminal and a second output terminal are provided in a clock driving circuit. A transfer clock outputted from the first output terminal is transmitted to a capacitor-resistor (CR) differentiator circuit to generate an undershoot waveform, and a direct current component is transmitted through the second output terminal. The reason for the two output terminals provided per transfer clock in the clock driving circuit is that the direct current component cannot be transmitted through the CR differentiator circuit and therefore that a current path needs to be separately provided to maintain the electric current that turns on the light emitting thyristors.

However, in the conventional self scanning print head, there are the following concerns with two output terminals per transfer clock in the clock driving circuit.

In the print head, a large number of self scanning thyristor array chips are provided, and the operation of the self scanning light emitting thyristor array chips is simultaneously performed in parallel for high speed operation. A 2-phase clock is used as a data transfer clock for the thyristor array chips, and two clocks are inputted to each thyristor array chip. Therefore, four output terminals are required in a clock driving circuit for the self scanning print head for driving each thyristor array chip.

Because a large number of self scanning thyristor array chips are arranged in a print head, the total number of output terminals provided in a clock driving circuit becomes enormous. If the number of terminals are controlled so that the terminals can be accommodated in a large-scale integration (hereinafter "LSI") package, a large number of chips that are connected in parallel and that are driven by a clock driving circuit are required, causing waveform rounding. As a result, there is a problem that the operation of the print head cannot be performed at high speed. In addition, there is a problem in the LSI that a large number of external parts, such as capacitors, for the CR differentiator circuit are required, which causes the cost to increase.

Therefore, lower-cost circuitry is desired that drives self scanning light emitting thyristors array chips using a buffer-circuit integrated circuit (hereinafter an "integrated circuit" is referred to as an "IC") that operates under a 3.3 V power source, for example, without increasing the number of terminals that can be accommodated in an LSI package that drives the print heads, and with a decreased number of external parts.

SUMMARY

A driving device disclosed in the present application drives a light emitting thyristor array including plural stages of light emitting thyristors, the plural stages of light emitting thyristors each including a first terminal, a second terminal, and a first control terminal that controls on and off switching between the first and second terminals, the first terminal being commonly connected to a first power source and the second terminal being commonly connected to a common terminal. The driving device includes: a first driving circuit that is operated by a second power source and that drives the common terminal at high and low logic levels; a scanning circuit that includes plural stages of scanning thyristors and that sequentially scans the plural stages of light emitting thyristors, the plural stages of scanning thyristors each including a third terminal, a fourth terminal, and a second control terminal that controls on and off switching between the third and fourth terminals, the third terminal being commonly connected to the first power source, the second control terminal of each stage being connected to the first control terminal of a light emitting thyristor of a corresponding stage; and a second driving circuit that is operated by the second power source, that generates first and second clock signals for driving the scanning circuit, and that outputs the first and second clock signals from first and second clock terminals, respectively. Wherein, the fourth terminal of an odd numbered stage scanning thyristor is commonly connected to the first clock terminal, the fourth terminal of an even numbered stage scanning thyristor is commonly connected to the second clock terminal, and the second control terminal of a first stage scanning thyristor is connected to the second clock terminal via a first resistor.

Another driving device disclosed in the present invention drives a light emitting thyristor array including plural stages of light emitting thyristors, the plural stages of light emitting thyristors each including a first terminal, a second terminal, and a first control terminal that controls on and off switching between the first and second terminals, the first terminal being commonly connected to a power source, and the second terminal being commonly connected to a common terminal. The driving device includes: a first driving circuit that is operated by the power source and that drives the common terminal at high and low logic levels; a scanning circuit that includes plural stages of scanning thyristors and that sequentially scans the plural stages of light emitting thyristors, the plural stages of scanning thyristors each including a third terminal, a fourth terminal, and second and third control terminals that control on and off switching between the third and fourth terminals, respectively, the third terminal being commonly connected to the power source, the third control terminal of each stage being connected to the first control terminal of a light emitting thyristor of a corresponding stage; and a second driving circuit that is operated by the power source, that generates first and second clock signals for driving the scanning circuit, and that outputs the first and second clock signals from first and second clock terminals, respectively. Wherein, the fourth terminal of an odd numbered stage scanning thyristor is commonly connected to the first clock terminal, the fourth terminal of an even numbered stage scanning thyristor is commonly connected to the second clock terminal, the third control terminal of a first stage scanning thyristor is connected to the second clock terminal via a first resistor, and the third control terminal of a previous stage scanning thyristor is connected to the second control terminal of a subsequent stage scanning thyristor via a forward direction inverter.

In another aspect, a print head disclosed in the present application includes the light emitting thyristor array and the driving device that are discussed above In another aspect, an image forming device disclosed in the present application includes the print head discussed above. Wherein, an image is formed on a recording medium by exposure by the print head.

In driving devices and print heads according to the present specification, one clock terminal is necessary for each transfer clock in the second driving circuit, which reduces the number of terminals required by half compared with a conventional configuration. In addition, areas for arranging external parts, such as capacitors, that are provided in the driving circuit of the conventional configuration are reduced. Therefore, not only is the data transfer speed improved in the print head, but also circuit size and cost are reduced as a result of the reduced number of clock terminals in the second driving circuit.

Further, by configuration the first driving circuit to include a first switching element and a first rectifying element and by configuration the second driving circuit to include an open-drain-type first buffer and a three-state-type second buffer, the light emitting thyristors and the scanning thyristors are not erroneously turned when the light emitting thyristors and the scanning thyristors are in the OFF state because the rectifying element exists in the current paths thereof.

Moreover, another driving device of the present application provides advantages similar to those of the above-described driving devices and further provides the following advantages. That is, the scanning thyristors are configured with 4-terminal thyristors, and inverters are provided between control terminals of the 4-terminal thyristors. Because inverters have directionality, erroneous operation of the scanning circuit is prevented. In addition, because an ON voltage for the inverters is small, the inverters can be operated with the VDD power source (e.g., 3.3. V), which allows power saving.

According to the image forming device of the present specification, because the above-described configuration is adapted, a high quality image forming device is provided with excellent space efficiency and light extraction efficiency.

DETAILED DESCRIPTION OF THE EMBODIMENTS

Embodiments of the present application become apparent when the description of the embodiments herein is read with reference to the attached drawings. However, the drawings are for explanatory purposes only and are not intended to limit the scope of the present embodiments.

Figure 2:
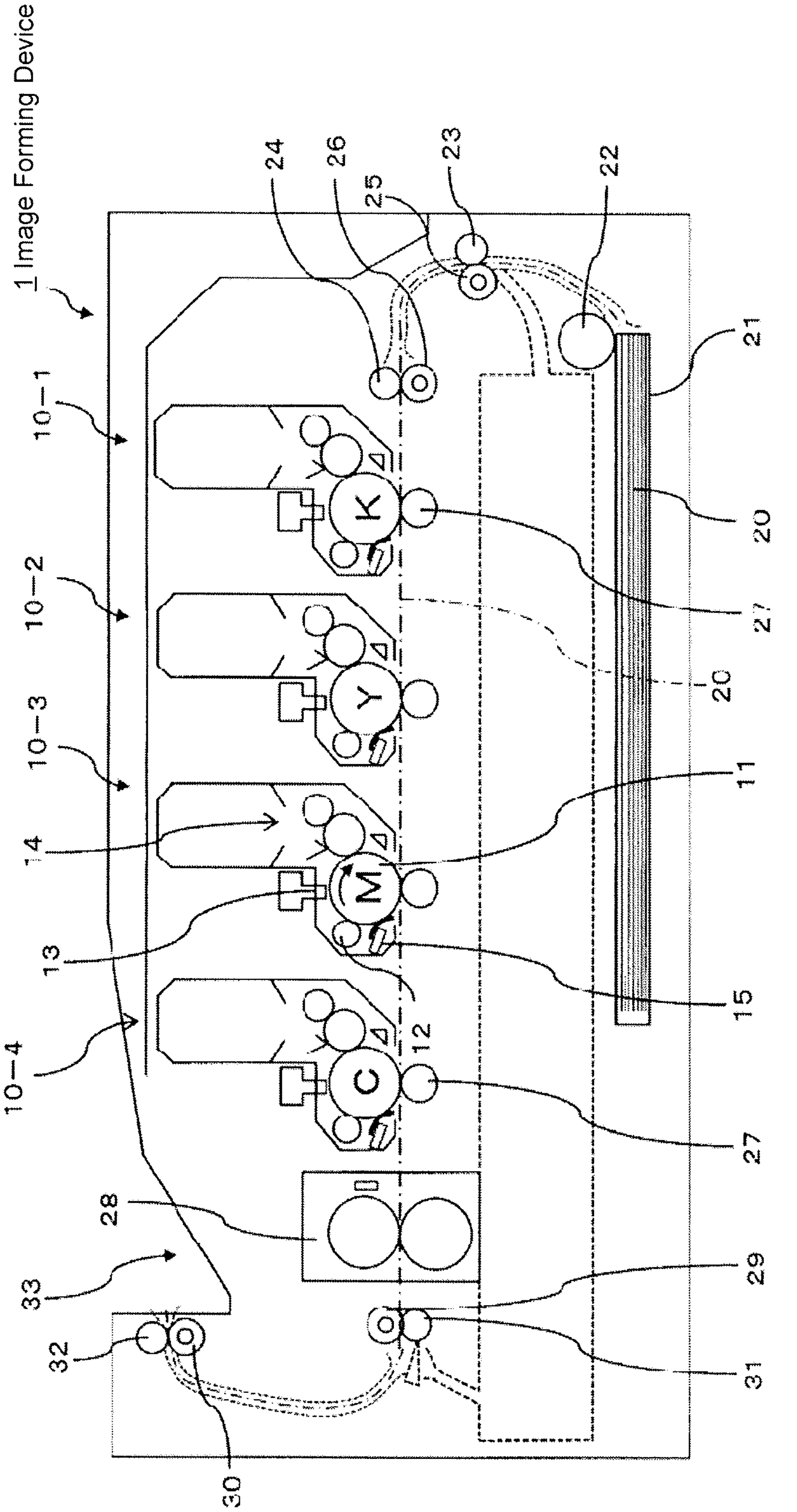
FIG. 2 illustrates a schematic configuration of an image forming device according to the first embodiment.

First Embodiment (Image Forming Device of First Embodiment) FIG. 2 illustrates a schematic configuration of an image forming device according to the first embodiment.

The image forming device 1 is configured from a tandem electrographic color printer, in which an exposure device (e.g., print head) including a light emitting thyristor array that uses driven elements (e.g., 3-terminal light emitting thyristors as the light emitting element) is installed. The image forming device 1 includes four process units 10-1 to 10-4, which form images in black (K), yellow (Y), magenta (M) and cyan (C), respectively. The process units 10-1 to 10-4 are sequentially arranged from the upstream side of a carrying path of a recording medium (e.g., paper) 20. Because the internal configuration of each of the process units 10-1 to 10-4 is the same, the internal configuration of the magenta process unit 10-3, for example, is explained as an example.

In the process unit 10-3, a photosensitive body (e.g., photosensitive drum 11), which functions as an image carrier, is rotatably arranged in the direction of the arrow shown in FIG. 2. Around the photosensitive drum 11, a charge device 12 that supplies electric charge to, and charges, the surface of the photosensitive drum 11, and a print head 13, which functions as an exposure device, that forms an electrostatic latent image on the photosensitive drum 11 by irradiating light selectively onto the charged surface of the photosensitive drum 11, are provided in order from the upstream side of the rotational direction. In addition, a developing device 14 and a cleaning device 15 are arranged. The developing device 14 develops an image by attaching magenta (predetermined color) toner on the surface of the photosensitive drum 11, on which the electrostatic latent image has been formed. The cleaning device 15 removes residue toner after the toner image is transferred on the photosensitive drum 11. The drum and rollers used in each of these devices are rotated by the motive power transmitted from a drive source (not shown) via gears and the like.

A sheet cassette 21 with sheets 20 stored therein is installed in the lower part of the image forming device 1. A hopping roller 22 for separating and carrying the sheets 20 piece by piece is provided above the sheet cassette 21. On the downstream side of the hopping roller 22 in a carrying direction of the sheet 20, pinch rollers 23 and 24, a carrying roller 25 and a registration roller 26 are provided. The carrying roller 25 carries the sheet 20 by pinching the sheet 20 with the pinch roller 23. The registration roller 26 corrects oblique passage of the sheet 20 and carries the sheet to the process unit 10-1 by pinching the sheet 20 with the pinch roller 24. The hopping roller 22, the carrying roller 25 and the registration roller 26 are rotated by the motive power transmitted from a drive source (not shown) via gears and the like.

At a position opposing the photosensitive drum 11 in each of the process units 10-1 to 10-4, a transfer roller 27 is provided that is formed from a semi-conductive rubber or the like. Electric charge is applied to each transfer roller 27 when transferring the toner image attached to the photosensitive drum 11 onto the sheet 20, so that a potential difference is provided between surface potential of the photosensitive drum 11 and surface potential of the transfer roller 27.

A fuser 28 is provided on the downstream side the process unit 10-4. The fuser 28 includes a heating roller and a backup roller. The fuser 28 is a device to fix the toner transferred onto the sheet 20 by pressure and heating. On the downstream side of the fuser 28, there are ejection rollers 29 and 30, ejection part pinch rollers 31 and 32, and a sheet stacker 33. The ejection rollers 29 and 30 pinch the sheet 20 ejected from the fuser 28, with the ejection part pinch rollers 31 and 32, respectively, and carry the sheet 20 to the sheet stacker 33. The fuser 28, the ejection roller 29 and the like are rotated by the motive power transmitted from the drive source (not shown) via gears and the like.

The image forming device 1 with the above-described configuration operates as follows. First, the sheets 20 stacked and stored in the sheet cassette 21 are carried piece by piece by the hopping roller 22. Then, each sheet 20 is pinched by the carrying roller 25, the registration roller 26 and the pinch rollers 23 and 24 and is carried between the photosensitive drum 11 and the transfer roller 27 of the process unit 10-1. The sheet 20 is sandwiched by the photosensitive drum 11 and the transfer roller 27 and is carried by the rotation of the photosensitive drum 11 while the toner image is transferred onto the recording surface of the sheet 20. The sheet 20 sequentially passes through the process units 10-2 to 10-4 in a similar manner. During this process, the toner image in each color, which is the image of the electrostatic latent image formed by the respective print head 13 and developed by the respective developing device 14, is sequentially transferred and superimposed on the recording surface of the sheet 20.

After the toner image in each color is superimposed on the recording surface of the sheet 20, the toner image is fixed on the sheet 20 by the fuser 28. Then, the sheet 20 is pinched by the ejection rollers 29 and 30 and the pinch rollers 31 and 32, respectively, and is ejected to the sheet stacker 33 outside the image forming device 1. A color image is formed on the sheet 20 through these processes.

Figure 3:
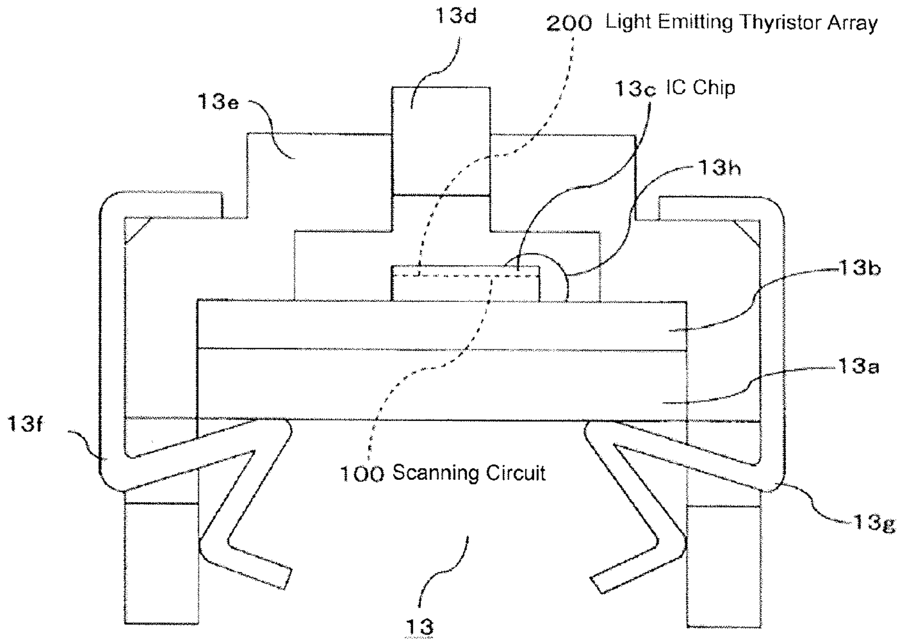
FIG. 3 is a schematic cross-sectional view that illustrates a configuration of a print head shown in FIG. 2.
Figure 4:
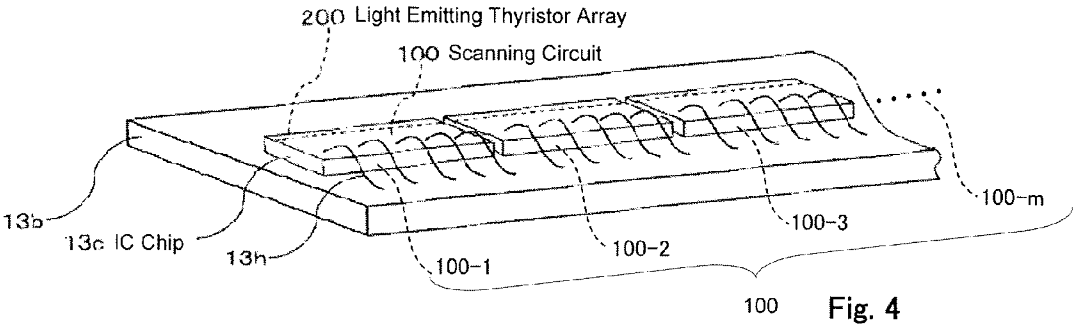
FIG. 4 is a perspective view that illustrates a substrate unit shown in FIG. 3.

(Print Head in First Embodiment) FIG. 3 is a schematic cross-sectional view that illustrates a configuration of the print head 13 shown in FIG. 2. FIG. 4 is a perspective view that illustrates the substrate unit shown in FIG. 3.

The print head 13 shown in FIG. 3 includes a base member 13*a*. The substrate unit shown in FIG. 4 is fixed on the base member 13*a*. The base unit is configured from a printed wiring board 13*b* that is fixed on the base member 13*a* and a plurality of IC chips 13*c* that is fixed by adhesive or the like on the printed wiring board 13*b*. The "m" pieces of scanning circuits 100 (100-1 to 100-*m*) are integrated on each IC chip 13*c* as self scanning parts. A light emitting thyristor array 200, on which a light element array (e.g., light emitting thyristor array) is approximately linearly provided, is arranged on each scanning circuit 100 as the main light emitting part. A plurality of terminals (not shown) on each IC chip 13*c* is electrically connected to a wiring pad (not shown) on the printed wiring board 13*b* by bonding wires 13*h*.

A lens array (e.g., rod lens array 13*d*), in which a large number of pillar-shaped optical elements are arranged, is positioned above the light emitting element array 200 on the plurality of IC chips 13*c*. The rod lens array 13*d* is fixed by a holder 13*e*. The base member 13*a*, the printed wiring board 13*b* and the holder 13*e* are fixed by clamp members 13*f* and 13*g*.

Figure 5:
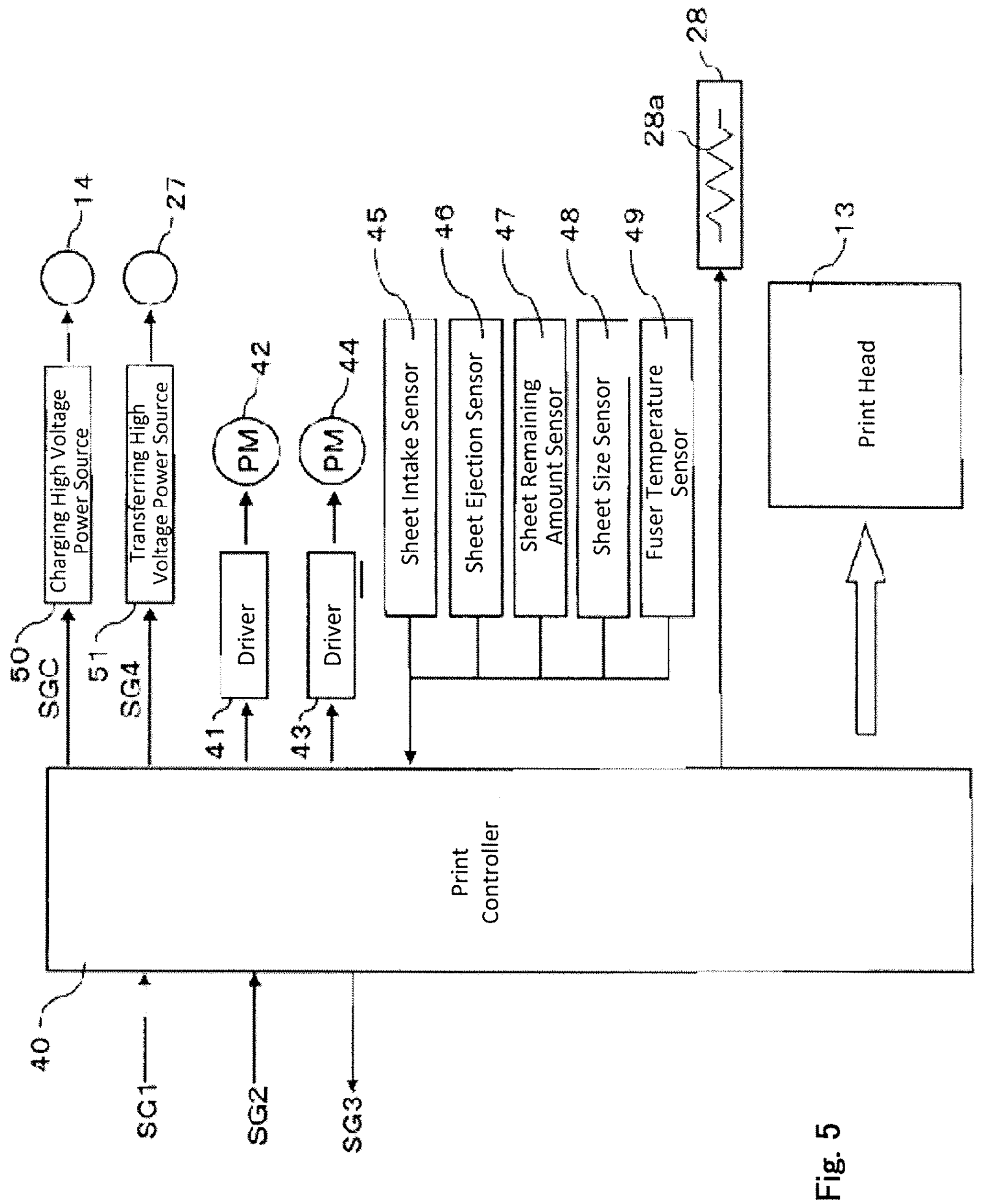
FIG. 5 is a block diagram that illustrates a schematic configuration of a printer control circuit in the image forming device shown in FIG. 2.

(Printer Control Circuit in First Embodiment) FIG. 5 is a block diagram that illustrates a configuration of a printer control circuit in the image forming device 1 shown in FIG. 2. To simplify the explanation, of four process units 10-1 to 10-4 disclosed in FIG. 2, a configuration for controlling one process unit (e.g., process unit for magenta 10-3) is shown in FIG. 5.

The printer control circuit shown in FIG. 5 includes a print controller 40 provided inside a printing part in the image forming device 1. The print controller 40 is configured from a microprocessor, a read-only memory (ROM), a random access memory (RAM), an input/output port for input and output of signals, a timer and the like. The print controller 40 has a function to perform print operations by sequence control of the entire printer using a control signal SG1 from a host controller (not shown), a video signal (one-dimensionally arrayed dot map data) SG2 and the like. The print head 13 for the respective one of the process units 10-1 to 10-4, a heater 28*a* for the fuser 28, drivers 41 and 43, a sheet intake sensor 45, a sheet ejection sensor 46, a remaining sheet amount sensor 47, a sheet size sensor 48, a fuser temperature sensor 49, a charging high voltage power source 50, a transferring high voltage power source 51 and the like are connected to the print controller 40. A developing/transferring process motor (permanent magnet or PM) 42 is connected to the driver 41. A sheet feeding motor (PM) 44 is connected to the driver 43. The developing device 14 is connected to the charging high voltage power source 50. The transfer roller 27 is connected to the transferring high voltage power source 51.

The following operation is performed on the printer control circuit with such a configuration. When the print controller 40 receives a print instruction by the control signal SG1 from the host controller, the print controller 40 first detects a temperature of the heater 28 by the fuser temperature sensor 49. More specifically, the print controller 40 determines using the fuser temperature sensor 49 whether or not the heater 28*a* in the fuser 28 is in a usable temperature range. When the heater 28*a* is not in the temperature range, electricity is passed through the heater 28*a* to heat the heater 28*a* to the usable temperature. Next, the developing/transferring process motor 42 is initiated. At the same time, the charging high voltage power source 50 is turned to the ON state by a charge signal SGC to charge the developing device 14.

Then, the presence and type of the sheet 20 stored in the sheet cassette 21 shown in FIG. 2 are detected by the remaining sheet amount sensor 47 and the sheet size sensor 48, and the sheet feeding that is appropriate for the detected sheet 20 is commenced. The sheet feeding motor 44 is bidirectionally rotatable by the driver 43. The sheet feeding motor 44 is first rotated in the reverse direction to feed the set sheet 20 by the predetermined amount until the sheet intake sensor 45 detects the sheet 20. Then, the sheet feeding motor 44 is rotated in the forward direction to carry the sheet 20 into the print mechanism inside the printer.

When the sheet 20 reaches a printable position, the print controller 40 sends a timing signal SG3 (including a main-scanning synchronization signal and a sub-scanning synchronization signal) to the image processor (not shown) and receives the video signal SG2. The video signal SG2, which has been edited for each page by the image processor and received by the print controller 40, is transmitted to each print head 13 as print data. Each print head 13 includes a scanning circuit 100 and a light emitting thyristor array 200 for single dot (pixel) printing.

Transmission and reception of the video signal SG2 is performed for each print line. The information to be printed by each print head 13 becomes a latent image with dots having increased potential on the respective photosensitive drum 11 (not shown) that has been charged by negative potential. The toner for image formation that has been charged by the negative potential adheres to each dot by electric attraction at the developing device 14 to form a toner image.

Thereafter, the toner image is forwarded to the transfer roller 27. In addition, the transferring high voltage power source 51 is turned to the ON state with positive potential by the transfer signal SG4. Therefore, the transfer roller 27 transfers the toner image on the sheet 20 that passes between the photosensitive drum 11 and the transfer roller 27. The sheet 20 with the transferred toner image is carried in contact with the fuser 28 that includes the heater 28*a*. The toner image is fixed onto the sheet 20 by the heat of the fuser 28. The sheet 20 with the fixed image is further carried from the print mechanism of the printer and through the sheet ejection sensor 46, and is ejected outside the printer.

The print controller 40 applies the voltage from the transferring high voltage power source 51 to the transfer roller 27 only while the sheet 20 passes the transfer roller 27 in response to the detection by the sheet size sensor 48 and the sheet intake sensor 45. When the printing is completed and the sheet 20 passes the sheet ejection sensor 46, application of the voltage to the developing device 14 by the charging high voltage power source 50 is stopped. At the same time, rotation of the developing/transferring process motor 42 is stopped. The above-described operation is repeated thereafter.

Figure 6:
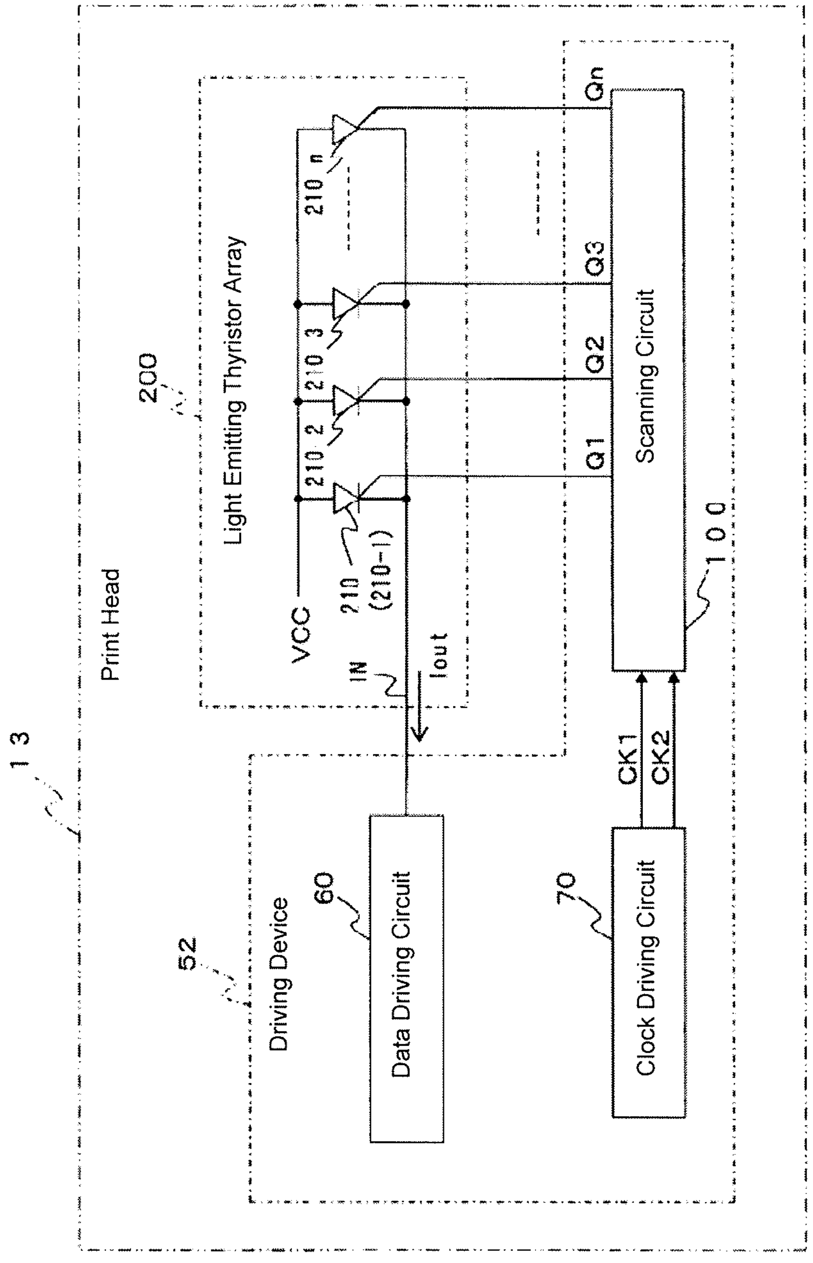
FIG. 6 is a schematic block diagram that illustrates a configuration of the print head shown in FIG. 5 according to the first embodiment.

(Print Head in First Embodiment) FIG. 6 is a block diagram that illustrates a schematic configuration of the print head 13 shown in FIG. 5 according to the first embodiment.

The print head 13 includes a light emitting thyristor array 200 formed on the IC chip 13*c* shown in FIG. 4, and a driving device 52 that drives the light emitting thyristor array 200. The driving device 52 is formed on the IC chip 13*c* shown in FIG. 4. The driving device 52 includes a scanning circuit 100 that outputs, from a plurality of output terminals Q1-Qn, signals for scanning the light emitting thyristor array 200 based on 2-phase clocks including a first clock and a second clock, a first driving circuit (e.g., data driving circuit 60) for driving a common terminal IN of the light emitting thyristor array 200 at a high-logic level (hereinafter referred to as "H level") and a low-logic level (hereinafter referred to as "L level"), and a second driving circuit (e.g., clock driving circuit 70) that generates and outputs the first clock and the second clock for driving the scanning circuit 100 respectively from a first clock terminal CK1 and a second clock terminal CK2, respectively.

The light emitting thyristor array 200, which is scanned by the scanning circuit 100, is configured from plural stages of P-gate light emitting thyristors 210 (210-1 to 210-*m*), which are 3-terminal thyristors, for example, as light emitting elements. In the embodiment, the numeral "m" represents the number of the emitting thyristors disposed on an IC chip. Each light emitting thyristor 210 includes a first terminal (e.g., anode), a second terminal (e.g., cathode) and a first control terminal (e.g., gate). The anode is connected to a power source (e.g., a VDD power source that outputs 3.3 V power source voltage VDD). The cathode is connected to the data driving circuit 60 via the common terminal IN through which drive current Iout flows as a data signal (hereinafter referred simply as "data"). The gate is connected to respective ones of output terminals Q1-Qm of the scanning circuits 100. As discussed below, the light emitting thyristors 210-1 to 210-*m* are divided into a plurality of groups of light emitting thyristors 210-1 to 210-*n*. Each group is separately and simultaneously driven in parallel by respective ones of the self scanning circuits 100. Similarly, the output terminals Q1-Qm are divided into a plurality of groups of output terminals Q1-Qn. Herein, the numeral "n" represents the numbers of the light emitting thyristors 210 and output terminals Q which belong to one group or array. Each light emitting thyristor 210 emits light when a trigger signal (e.g., trigger current) flows to the gate under a state where the power source voltage VDD is applied between the anode and cathode, and the light emitting thyristor 210 is turned to the ON state as cathode current flows between the anode and the cathode.

Figure 1:
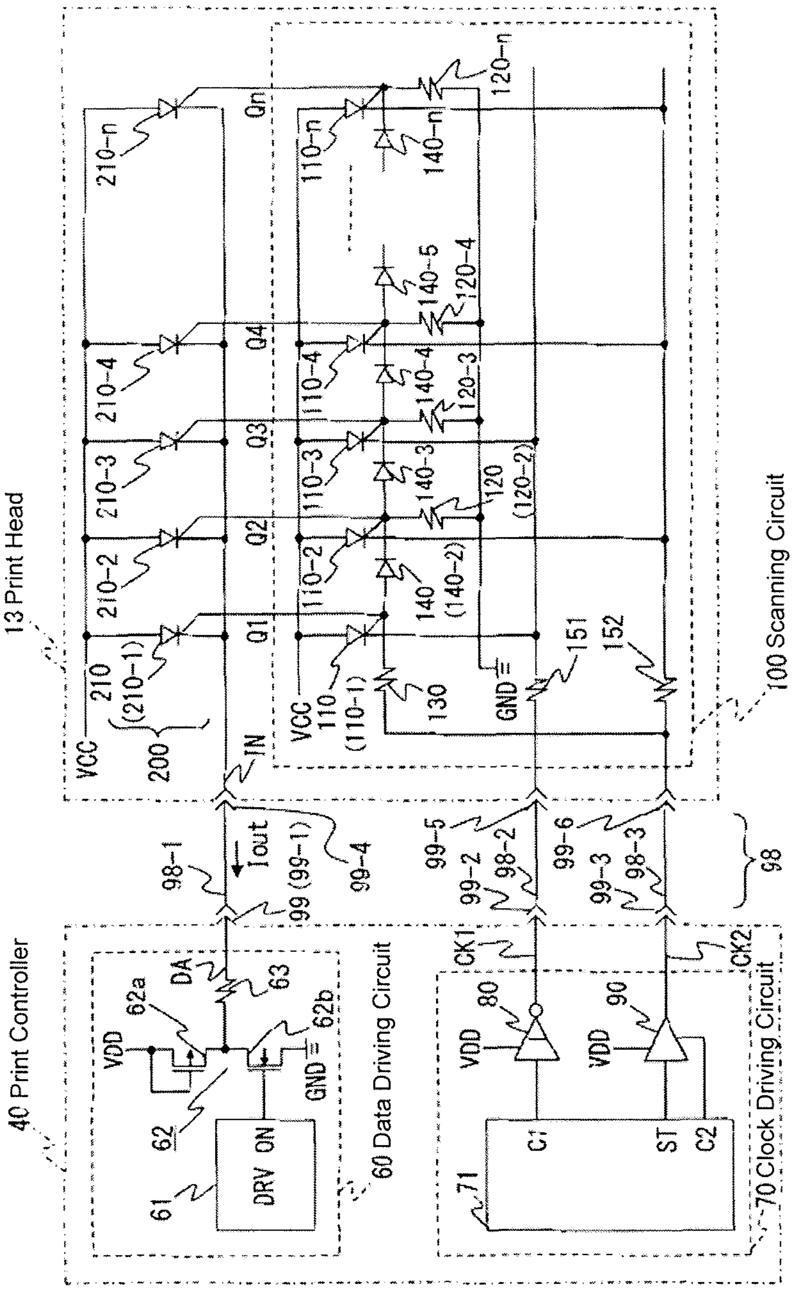
FIG. 1 is a block diagram that illustrates a configuration of a print head shown in FIG. 6 according to a first embodiment.

FIG. 1 is a circuit diagram that illustrates a configuration of the print head 13 shown in FIG. 6 in the first embodiment.

In the print head 13 shown in FIG. 1, among the data driving circuit 60, the clock driving circuit 70 and the scanning circuit 100 that configure the driving device 52, the scanning circuit 100 is arranged in the print head 13, and the data driving circuit 60 and the clock driving circuit 70 are arranged in a print controller 40. As shown in FIG. 6, the data driving circuit 60 and the clock driving circuit 70 may be arranged inside the print head 13.

The print head shown in FIG. 1 includes the scanning circuits 100 and the light emitting thyristor arrays 200 formed on the IC chips 13*c* shown in FIG. 4. The scanning circuits 100 and the light emitting thyristor arrays 200 are connected to a plurality of data driving circuits 60 and clock driving circuits 70 via a plurality of connection cables 98 (98-1 to 98-3) and a plurality of connection connectors 99 (99-1 to 99-6), respectively.

For the plural stages of the light emitting thyristors 210 (210-1 to 210-*n*) that configure the light emitting thyristor array 200, the anode is connected to the VDD power source, the cathode is connected to the connection connector 99-4 via the common terminal IN, and the gate is connected to respective ones of output terminals Q1-Qn of the scanning circuits 100. The total number of the light emitting thyristors 210-1 to 210-*m* (and output terminals Q1-Qm) is 4,992 (m=4,992) with the print head 13, which is capable of printing an A4-size sheet at a resolution of 600 dots per inch. These light emitting thyristors form the array.

Each scanning circuit 100 is driven by the first and second clocks, which are 2-phase clocks, supplied from the clock driving circuit 70 via the first and second clock terminals CK1 and CK2, the connection connectors 99-2 and 99-3, and the connection cables 98-2 and 98-3, and the connection connectors 99-5 and 99-6. The scanning circuit 100 is a circuit that causes the light emitting thyristors array 200 to perform ON/OFF switching by applying the trigger current thereto. The scanning circuit 100 includes plural stages of 3-terminal switching elements (e.g., P-gate scanning thyristors 110-1 to 110-*n*; e.g., n=192), a plurality of second resistors 120 (120-2 to 120-*n*), a first resistor for start signals to which the second clock outputted from the second clock terminal CK2 is inputted, plural stages of diodes 140 (140-1 to 140-*n*) for determining the scanning direction, and resistors 151 and 152. The scanning circuit 100 is configured from self scanning shift resistors.

The scanning thyristors 110 (110-1 to 110-*n*) of the respective stages each include a third terminal (e.g., anode), a fourth terminal (e.g., cathode) and a second control terminal (e.g., first gate). The anodes are connected to the VDD power source as a first power source. The gates are output to the gates of the light emitting thyristors 210 of the respective stages via the respective connection terminals Q1-Qn and are also connected to ground GND via the respective resistors 120 (120-2 to 120-*n*). However, the resistor 120 is not provided between the gate of the first stage scanning thyristor 110-1 and ground GND.

The cathodes of the odd numbered stage scanning thyristors 110-1, 110-3, . . . , 110-(*n*-1) are connected to the connection connector 99-5 via the resistor 151. The cathodes of the even numbered stage scanning thyristors 110-2, 110-4, . . . , 110-*n* are connected to the connection connector 99-6 via the resistor 152.

The gate of the first stage scanning thyristor 110-1 is connected to the connection connector 99-6 via the resistor 130. Of the first stage scanning thyristor 110-1 to the last stage scanning thyristor 110-*n*, the gates are connected to each other via the respective diodes 140 (140-2 to 140-*n*). Each diode 140 is provided for determining a scanning direction (e.g., rightward direction in FIG. 1) at the time when the light emitting thyristors 210-1 to 210-*n* are sequentially turned on.

The scanning thyristor 110 of each stage has a layer structure, and performs circuit operations, similar to that of the light emitting thyristor 210 of each stage. The scanning thyristors 110 do not require the light emitting function as performed by the light emitting thyristors 210. Therefore, the upper layer of the self scanning thyristor 111 is covered by a non-translucent material, such as a metal film, to block light.

In the scanning circuit 100, the scanning thyristors 110-1 to 110-*n* are alternatively turned on based on the first and second clocks, which are 2-phase clocks, supplied from the first and second clock terminals CK1 and CK2 of the clock driving circuit 70. The ON state is transmitted to the light emitting thyristor array 200 and functions to designate a light emitting thyristor to emit light among the light emitting thyristors 210-1 to 210-*n*. The ON state of the scanning thyristors 110 of each stage to be turned on is transmitted to the adjacent scanning thyristor 110 for each of the first and second clocks, which are 2-phase clocks, and thereby performing a circuit operation similar to a shift resistor.

For the first stage scanning thyristor 110-1, unlike the second to last stage scanning thyristors 110-2 to 110-*n*, the resistor 120 does not exist between the gate and ground GND. This is to reduce the number of parts. If cost is not a consideration, the resistor 120 may be provided between the gate of the first stage thyristor 110-1 and ground GND.

The plurality of data driving circuits 60 connected to the light emitting thyristor arrays 200 are circuits that generate a first control signal DRV ON, which is a drive command signal, and that causes the drive current Iout to flow to the common terminal IN as data for driving the plurality of light emitting thyristor arrays 200 by time division. The clock driving circuit 70 connected to the scanning circuit 100 is a circuit that generates second, third and fourth control signals C1, ST and C2 and that outputs the first and second clocks, which are 2-phase signals, to be supplied to the scanning circuit 100.

To simplify the explanation, only one data driving circuit 60 is illustrated in FIG. 1. The plurality of light emitting thyristor arrays 200 includes a total of 4,992 light emitting thyristors 210-1 to 210-*m*, for example. The light emitting thyristors 210 are grouped by sets of light emitting thyristors 210-1 to 210-*n*. The groups of light emitting thyristors 210-1 to 210-*n* are separately driven simultaneously in parallel by the data driving circuits 60 respectively provided for each group.

Describing an example of typical design, 26 chips each including a light emitting thyristor array 200, in which 192 light emitting thyristors 210 (210-1 to 210-*n*) are arrayed, are arranged on a printed wiring board 13*b* as shown in FIG. 4. As a result, the required 4,992 light emitting thyristors 210-1 to 210-*m* are formed on the print head 13. At this time, the data driving circuits 60 are provided in correspondence with the 26 light emitting arrays 200. Therefore, the total number of output terminals from the data driving circuits 60 is 26.

On the other hand, the clock driving circuit 70 drives the chip that includes the arrayed scanning circuits 100. The clock driving circuit 70 is required for not only simply generating the clocks but also controlling the energy to turn on the below-discussed scanning thyristors 110. To perform fast operation of the print head 13, it is preferable to provide the clock driving circuit 70 for each scanning circuit 100. However, if the data transmission by the print head 13 can be slow, the clock terminals CK1 and CK2, which are the output terminals of the clock driving circuit 70, and the plurality of scanning circuits 100 may be connected in parallel so that these circuits can be shared.

The data driving circuit 60 includes a data control circuit 61 that generates the control signal DRV ON, an open-drain-type buffer (e.g. open-drain-type inverter 62) that drives the control signal DRV ON, and a resistor 63 that is connected between the CMOS inverter 62 and the data terminal DA.

The open-drain-type inverter 62 includes a first MOS transistor (e.g., P-channel MOS transistor 62*a*; hereinafter "PMOS") of a first conductive type, and a first switching element (e.g., N-channel MOS transistor 62*b* (hereinafter "NMOS") that is a second MOS transistor of a second conductive type that has a reverse polarity of the first conductive type) that switches on and off by the control signal DRV ON. The PMOS 62*a* and the NMOS 62*b* are connected in series between the second power source (e.g., VDD power source that outputs a power source voltage VDD at 3.3 V) and ground GND.

Of the PMOS 62*a*, the source and gate are connected to the VDD power source, and the drain is connected to ground via the drain and source of the NMOS 62*b* and to the data terminal DA via the resistor 63. The PMOS 62 is configured in the OFF state. This is because the data driving circuit 60 is fabricated using a complementary MOS transistor (hereinafter "CMOS") semiconductor process and because a parasitic diode, which is a first rectifying element, generated between the drain and the substrate of the PMOS 62*a* is used as a static protection element for the output terminal.

For example, when the control signal DRV ON that is outputted from the data control circuit 61 is at the L level, the NMOS 62*b* is turned to the OFF state. Therefore, the data terminal DA is turned to a high impedance (hereinafter "Hi-Z") output state. Accordingly, the cathode of the light emitting thyristor 210 opens via the common terminal IN, and the cathode current is cut off. As a result, all of the light emitting thyristors 210-1 to **210-*n*** are turned to a non-light emission state.

On the other hand, when the control signal DRV ON is at the H level, the NMOS **62*b* is turned to the ON state. Therefore, the data terminal DA falls approximately to a GND potential via the data terminal DA, the connection connector 99-1, the connection cable 98-1, the connection connector 99-4 and the common terminal IN. Therefore, the voltage that is approximately equivalent to the power source voltage VDD is applied between the anode and cathode of the light emitting thyristors 210-1 to 210-*n***.

The clock driving circuit 70 includes a clock control circuit 71 that generates the second, third and fourth control signals C1, ST and C2, an open-drain-type first buffer (e.g., open-drain-type inverter 80) that is operated by the VDD power source and that drives and outputs the second control signal C1 to the first clock terminal CK1, and a three-state-type second buffer (e.g., three-state-type inverter 90) that is operated by the VDD power source and that drives and outputs the third clock ST to the second clock terminal CK2 based on the fourth control signal C2.

The open-drain type inverter 80 includes a configuration similar to that for the open-drain type inverter 62 in the data driving circuit 60. The three-state-type buffer 90 is a circuit that outputs to the second clock terminal CK2 a second clock that changes to the H level or L level depending on the H-level or L-level state of the inputted third control signal ST when the fourth control signal C2 is at the H level, and that causes the second clock terminal CK2 to be turned to the Hi-Z output state regardless of the H-level or L-level state of the inputted third control signal ST when the fourth control signal C2 is at the L level.

The VDD power source used by the data driving circuit 60 and the clock driving circuit 70 is configured at a voltage value different from the VCC power source used by the light emitting thyristors 210 and the scanning circuit 100 (power source voltage VDD<power source voltage VCC).

Describing a typical design example, the power source voltage VDD is 3.3 V, and the power source voltage VCC is 5 V. These are power source voltages that are normally used in electronic circuits. However, the print controller 40, which includes the data driving circuit 60 and the clock driving circuit 70, includes elements, such as a large-scale integrated circuit (LSI) and is manufactured by a semiconductor micro-fabrication process. Due to the semiconductor scaling rule, the power source voltage thereof must be low. In contrast, the semiconductor elements used in the print head 13 do not require much miniaturization. Therefore, sufficient withstand voltage is secured. As such, the power source voltage VDD for the data driving circuit 60 and the clock driving circuit 70 is set to 3.3 V, and the power source voltage VCC for the thyristors is set to 5 V.

Figure 7A:
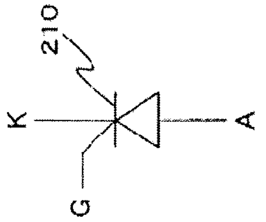
FIGS. 7A-7C illustrate a configuration of scanning thyristors shown in FIG. 1.
Figure 7B:
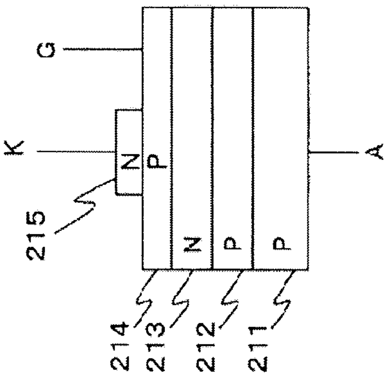
Figure 7C:
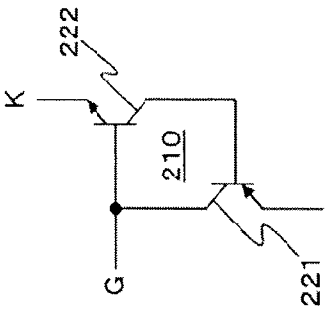

(Light Emitting Thyristor in First Embodiment) FIGS. 7A-7C illustrate a configuration of the light emitting thyristor 210 shown in FIG. 1.

FIG. 7A shows circuit symbols of the light emitting thyristor 110 and includes an anode A, a cathode K and a gate G.

FIG. 7B illustrates a cross-sectional configuration of the light emitting thyristor 210. Using a P-type GaAs wafer substrate, the light emitting thyristor 210 is fabricated by epitaxially growing predetermined crystals on the GaAs wafer substrate by a known metal organic-chemical vapor deposition (MO-CVD) method.

That is, on the P-type GaAs wafer substrate 211, a four-layer wafer with a PNPN configuration is formed by sequentially layering a P-type layer 212, an N-type layer 213, a P-type layer 214 and an N-type layer 215. In the P-type layer 212, a P-type impurity is contained in an AlGaAs material. The N-type layer 213 is formed to contain an N-type impurity. The P-type layer 214 is formed to contain a P-type impurity. The N-type layer 215 is formed to contain an N-type impurity. Next, using a known etching method, element isolation is performed by forming a trench (not shown). Moreover, in the above-described etching, a part of the P-type layer 214 is exposed, and metal wiring is formed in the exposed region to form the gate G. Similarly, a part of the N-type layer 215, which is the top layer of the scanning thyristor 110, is exposed, and metal wiring is formed in the exposed region to form the cathode K. Similarly, the anode A is formed by forming a metal electrode on the bottom surface of the P-type GaAs wafer substrate 211.

FIG. 7C is a representative circuit schematic of the light emitting thyristor 210 in contrast with FIG. 7B. The light emitting thyristor 110 is configured from a PNP transistor (hereinafter "PNPTR") 221 and an NPN transistor (hereinafter "NPNTR") 222. The emitter of the PNPTR 221 corresponds to the anode A of the light emitting thyristor 210. The base of the NPNTR 222 corresponds to the gate G of the light emitting thyristor 210. The emitter of the NPNTR 222 corresponds to the cathode K of the light emitting thyristor 210. The collector of the PNPTR 221 is connected to the base of the NPNTR 222. The base of the PNPTR 221 is connected to the collector of the NPNTR 222.

The light emitting thyristor 210 shown in FIGS. 7A-7C is configured by forming an AlGaAs layer on a GaAs wafer substrate. However, the scanning thyristor 110 is not limited to this configuration, but a material, such as GaP, GaAsP, AlGaInP, InGaAsP or the like may be used. In addition, the scanning thyristor 110 may be configured by forming a material, such as GaN, AlGaN, InGaN, InGaN or the like on a sapphire substrate.

(Schematic Operation of Print Head in First Embodiment) In FIGS. 1 and 6, among the control signals C1, ST and C2 that are outputted from the clock control circuit 71 in the clock driving circuit, when the control signals C1, ST and C2 are turned to the H level, for example, the output terminal of the inverter 80 is turned to the L level, and as the output buffer 90 is turned to the ON state, the output terminal of the output buffer 90 is turned to the H level.

As the output terminal of the inverter 80 is turned to the L level, the cathode of the first stage scanning thyristor 110-1 is turned to the L level via the first clock terminal CK1, the connection connector 99-2, the connection cable 98-2, the connection connector 99-5 and the resistor 151. In addition, the gate of the scanning thyristor 110-1 is turned to the H level (≈power source voltage VCC (5 V)) via the second clock terminal CK2, the connection connector 99-3, the connection cable 98-3, the connection connector 99-6 and the resistor 130. As a result, the scanning thyristor 110-1 is turned to the ON state. Then, the shift operation of the scanning circuit 100 is initiated in response to the CK1 and CK2 signals, and the gates G of the subsequent stage scanning thyristors 110-2 to **110-*n*** are sequentially turned to the H level (≈power source voltage VCC (5 V)).

Meanwhile, when the control signal DRV ON outputted from the data control circuit 61 in the data driving circuit 60 is at the L level, the NMOS **62*b* in the inverter 62 is turned to the OFF state, and the data terminal DA is turned to the Hi-Z output state. As a result, the cathode of the light emitting thyristor 210 opens via the connection connector 99-1, the connection cable 98-1, the connection connector 99-4 and the print head 13 side connection terminal IN, and thereby the cathode current is cut off. Therefore, the drive current Iout that flows to the data terminal DA is turned to zero. As a result, all of the light emitting thyristors 210-1 to 210-*n*** are turned to the non-light emission state.

In contrast, when the control signal DRV ON outputted from the data control circuit 61 is at the H level, the NMOS **62*a* in the inverter 62 is turned to the ON state, and the data terminal DA is turned to the L level (≈GND potential=0 V) via the resistor 63. As a result, the common terminal IN is also turned to the L level (≈GND potential=0 V) via the connection connector 99-1, the connection cable 98-1 and the connection connector 99-4, and an approximate power source voltage VCC (≈5 V) is applied between the anode and cathode of each light emitting thyristor 210**.

At this time, of the light emitting thyristors 210-1 to **210-*n*, the gate of only the light emitting thyristor 210 provided with an instruction to emit light is selectively turned to the H level by the scanning circuit 100. Therefore, trigger current is generated between the gate and cathode of that light emitting thyristor 210, and thereby the light emitting thyristor 210 provided with the instruction to emit light is turned on. The current that flows to the cathode of the light emitting thyristor 210 that has turned on is the current that flows to the data terminal DA (that is, the drive current Iout). Therefore, the light emitting thyristor 210** is turned to the light emission state and generates a light emission output that corresponds to the value of the drive current Iout.

(Detailed Operation of Print Head in First Embodiment)

Figure 8:
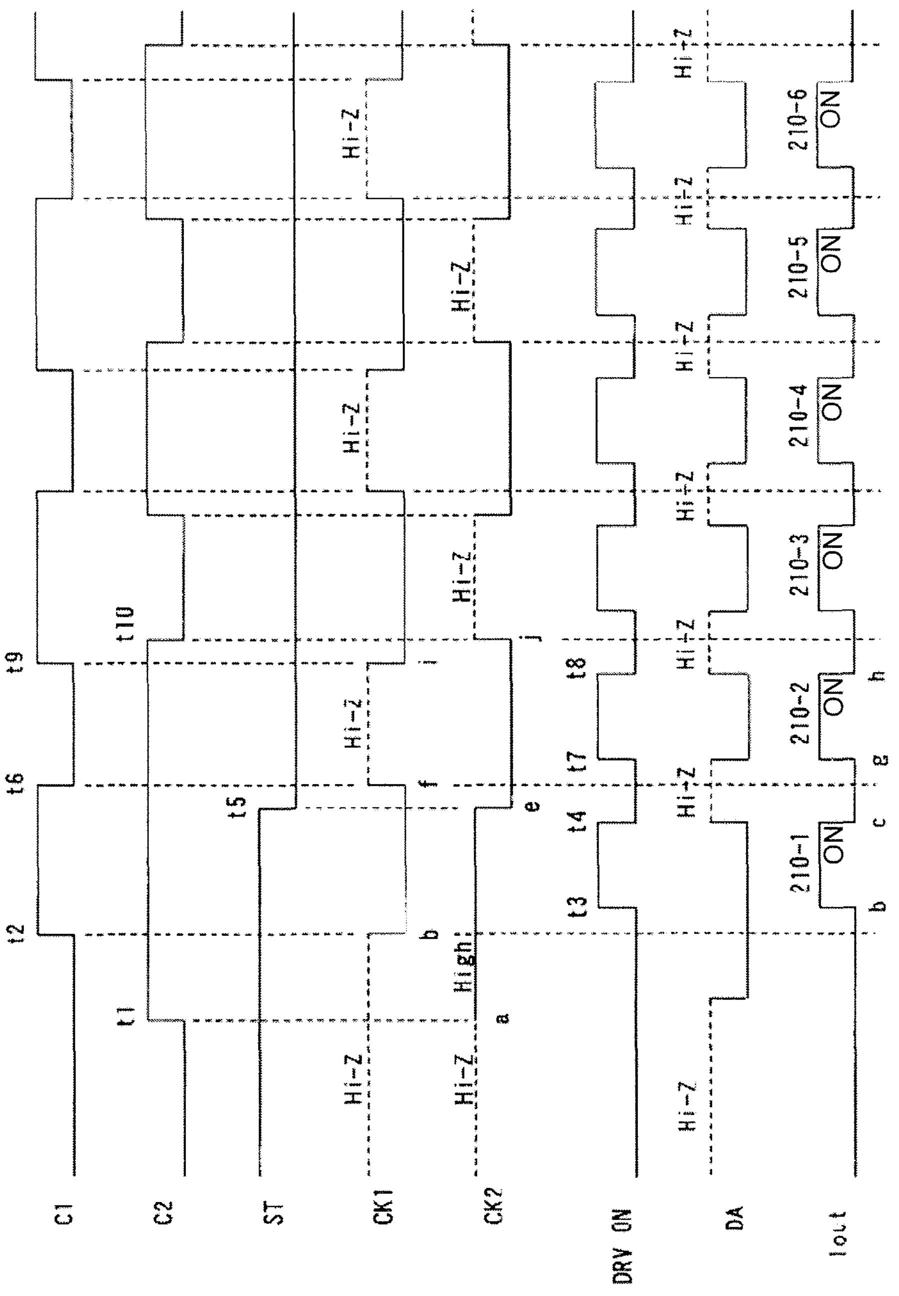
FIG. 8 is a timing chart that illustrates switching of the circuit shown in FIG. 1.

FIG. 8 is a timing chart that illustrates a detailed operation of the print head 13 shown in FIG. 1.

FIG. 8 shows operational waveforms during a case in which the light emitting thyristors 210-1 to **210-*n* (e.g., n=6) in FIG. 1 are sequentially turned on in a single line scanning during the print operation in the image forming device 1 shown in FIG. 2**.

In the case of the scanning circuit 100 that uses the scanning thyristors 110 as in the first embodiment, 2-phase clocks that are supplied from the clock terminals CK1 and CK2 are used. The 2-phase clocks are outputted from the clock driving circuit 70.

In the timing chart shown in FIG. 8, the control signals C1 and C2 outputted from the clock control circuit 71 are at the L level, and the control signal ST is at the H level in a state shown at the left end part. As a result, the clock terminal CK on the output side of the inverter 80 and the clock terminal CK2 on the output side of the output buffer 90 are turned to the Hi-Z output state shown by broken lines in FIG. 8. Thereby, the cathodes of a set of the odd numbered stage scanning thyristors 110-1, 110-3, . . . and the cathodes of a set of the even numbered stage scanning thyristors 110-2, 110-4, . . . are opened, and thus the cathode current is cut off. Therefore, the set of the odd numbered stage scanning thyristors 110-1, 110-3, . . . and the set of the even numbered stage scanning thyristors 110-2, 110-4, . . . are turned to the OFF state, and thus the all of the scanning thyristors 110-1 to **110-*n* in the scanning circuit 100** are turned to the OFF state.

In addition, the control signal DRV ON outputted from the data control circuit 61 is at the L level. The NMOS **62*b* in the inverter 62 is in the OFF state, and output terminal of the inverter 62 is in the Hi-Z output state. Therefore, the cathode current at the cathodes of the light emitting thyristors 210-1 to 210-*n* that are connected to the common terminal IN is cut off. Therefore, the light emitting thyristors 210-1 to 210-*n*** are also in the OFF state.

In addition, the current is not generated at not only the scanning thyristors 110-1 to **110-*n* and the light emitting thyristors 210-1 to 210-*n* but also the resistors 120-2 to 120-*n* and 130 and the diodes 140-2 and 140-*n*. In the state shown at the left end part of the timing chart in FIG. 8, the print head 13 is in a state in which the consumed current is approximately zero. As a result, in the image forming device 1 using the print head 13, it is possible to reduce the power consumed by configuring the print head 13** in the above-described logic state.

The below descriptions explain (1) a process for turning on the first stage scanning thyristor 110-1, (2) a process for turning on the second stage scanning thyristor 110-2, (3) an operation for translating a start signal (t2), (4) an operation for turning on the second stage scanning thyristor 110-2 (t5), and (5) the OFF state of the first stage light emitting thyristor 210-1.

(1) Process for Turning on the First Stage Scanning Thyristor 110-1

At t1 shown in FIG. 8, of the control signals C1, ST and C2 outputted from the clock control circuit 71, the control signal C2 rises and is turned to the H level. As a result, the clock terminal CK2 is turned from the Hi-Z state to the H level as shown at part a.

At t2, the control signal C1 rises and is turned to the H level. As a result, the clock terminal CK1 falls from the Hi-Z state to the L level state as shown at part b. At this time, the clock terminal CK2 is at the H level. Therefore, the current flows from the clock terminal CK2 to the clock terminal CK1 through the resistor 130, between the gate and cathode of the scanning thyristor 110-1 and through the resistor 151. Thereby the scanning thyristor 110-1 is turned on with this current as the trigger current.

In a typical design example, the voltage between the gate and cathode of the scanning thyristor 110-1 is approximately 1.6 V when the scanning thyristor 110-1 is turned on. In addition, the power source voltage VDD of the clock driving circuit 70 is 3.3 V, and the H-level voltage of the clock terminal CK2 is approximately equivalent to the power source voltage VDD. Therefore, the H-level voltage is enough to generate the gate current at the scanning thyristor 110-1.

At t3, when the control signal DRV ON outputted from the data control circuit 61 rises to the H level, the NMOS **62*b* in the inverter 62 is turned to the ON state, and the data terminal DA is turned to the L level via the resistor 63. As a result, a voltage at 5 V, which is approximately equivalent to the power source voltage VDD, is applied between the anode and cathode of the light emitting thyristor 210-1** via the common terminal IN.

At this time, because the scanning thyristor 110-1 is in the ON state, the gate potential is approximately equivalent to the power source voltage VCC (5 V). The scanning thyristor 110-1 and the light emitting thyristor 210-1 share the gate potential. This gate potential is approximately 5 V. When the data terminal DA is turned to the L level at t3, the cathode potential at the light emitting thyristor 210-1 is also at the L level (approximately 0 V). Therefore, the voltage is applied between the gate and cathode thereof to cause the gate current, and thereby the light emitting thyristor 210-1 is turned on. As a result, the drive current Iout is generated at the cathode of the light emitting thyristor 210-1 as shown at part c. Therefore, the light emission output is generated in response to the value of the drive current Iout.

At t4, when the control signal DRV ON falls to the L level, the NMOS **62*b* in the inverter 62 is turned to the OFF state. Therefore, the data terminal DA is turned to the Hi-Z state via the resistor 62. As a result, as described later, the cathode current path of the light emitting thyristor 210-1 is cut off, and the light emitting thyristor 210-1** is turned to the OFF state. Accordingly, the drive current Iout becomes approximately zero as shown at part d.

In the first embodiment, a latent image is formed on the photosensitive drum 11 shown in FIG. 2 by causing the light emitting thyristor 210-1 to emit light. The amount of exposure energy at this time is a product of the light emission power based on the value of the drive current Iout and the exposure time (=t4–t3). Therefore, even if there is a difference in luminous efficiency originated from the fluctuations in manufacturing the light emitting thyristor 210-1 and the like, the fluctuations in the amount of exposure energy may be corrected by adjusting the exposure time for each light emitting thyristor 210. In addition, when the light emission by the light emitting thyristor 210-1 is not necessary, the control signal DRV ON is maintained at the L level between t3 and t4. Therefore, the light emission by the light emitting thyristor 210 may be controlled by the control signal DRV ON.

(2) Process for Turning on Second Stage Scanning Thyristor 110-2

At t5, the control signal ST falls from the H level to the L level. Because the output buffer 90 is the output enable state as the control signal C2 is at the H level, the output terminal of the output buffer 90 is turned to the L level at t5, and the clock terminal CK2 falls from the H level to the L level as shown at part 2. At this time, the scanning thyristor 110-1 is in the ON state, and the gate is at the H level. The H level at the gate of the scanning thyristor 110-1 is transmitted to the gate of the scanning thyristor 110-2 by the diode 140-2, causing the gate current that flows to the clock terminal CK2 between the gate and cathode of the scanning thyristor 110-2 and via the resistor 152 to be generated. As a result, the scanning thyristor 110-2 is turned on.

At t6, the control signal C1 falls to the L level, and the clock terminal CK1 is turned to the Hi-Z state as shown at part f. As a result, the cathode current path of the scanning thyristor 110-1 is cut off, and the scanning thyristor 110-1 is turned off.

At t7, when the control signal DRV ON rises to the H level, the NMOS 62*b* in the inverter 62 is turned to the ON state. Therefore, the data terminal DA is turned to the L level via the resistor 63. When the data terminal DA is turned to the L level, a voltage approximately equivalent to the power source voltage VCC is applied between the anode and cathode of the light emitting thyristor via the common terminal IN At this time, the scanning thyristor 110-2 is in the ON state, and the scanning thyristor 110-2 is in the OFF state. Because the scanning thyristor 110-2 is in the ON state, the light emitting thyristor 210-2, which shares the gate current with the gate of the scanning thyristor 110-2, is turned on. As a result, as shown at part g, the drive current Iout is generated at the cathode of the light emitting thyristor 210-2, and the light emission is generated in response to the value of the drive current Iout.

At t8, the control signal DRV ON falls to the L level, the NMOS 62*b* in the inverter is turned to the OFF state, and the data terminal DA is turned to the Hi-Z state via the resistor 63. As a result, the cathode current path at the light emitting thyristor 210-2 is cut off via the common terminal IN, and the light emitting thyristor 201-2 is turned to the OFF state. Therefore, the drive current Iout becomes approximately zero as shown at part h.

At t9, the control signal C1 rises to the H level, and the clock terminal CK1 is turned from the Hi-Z state to the L level as shown at part i. At this time, the scanning thyristor 110-2 is in the ON state, and the gate thereof is at the H level. The H-level signal is transmitted to the gate of the scanning thyristor 110-3 by the diode 140-3, causing the gate current that flows to the clock terminal CK1 between the gate and cathode of the scanning thyristor 110-3 and via the resistor 151 to be generated. As a result, the scanning thyristor 110-3 is turned on.

At t10, the control signal C2 is turned to the L level. At this time, the control signal ST is at the L level, and as the control signal C2 is turned to the L level, the output terminal of the output buffer 90 is turned to the Hi-Z state. As a result, as shown at part j, the clock terminal CK2 is turned to the Hi-Z state, and the cathode current path of the scanning thyristor 110-2 is cut off via the resistor 152. Therefore, the scanning thyristor 110-2 is turned off.

Similarly, the transition of the control signals C1 and C2 and the turning on and off of the control signal DRV ON sequentially occur. Thereby, the scanning thyristors 110-3 to 110-*n* are sequentially turned on.

(3) Operation for Translating a Start Signal (t2)

Figure 9A:
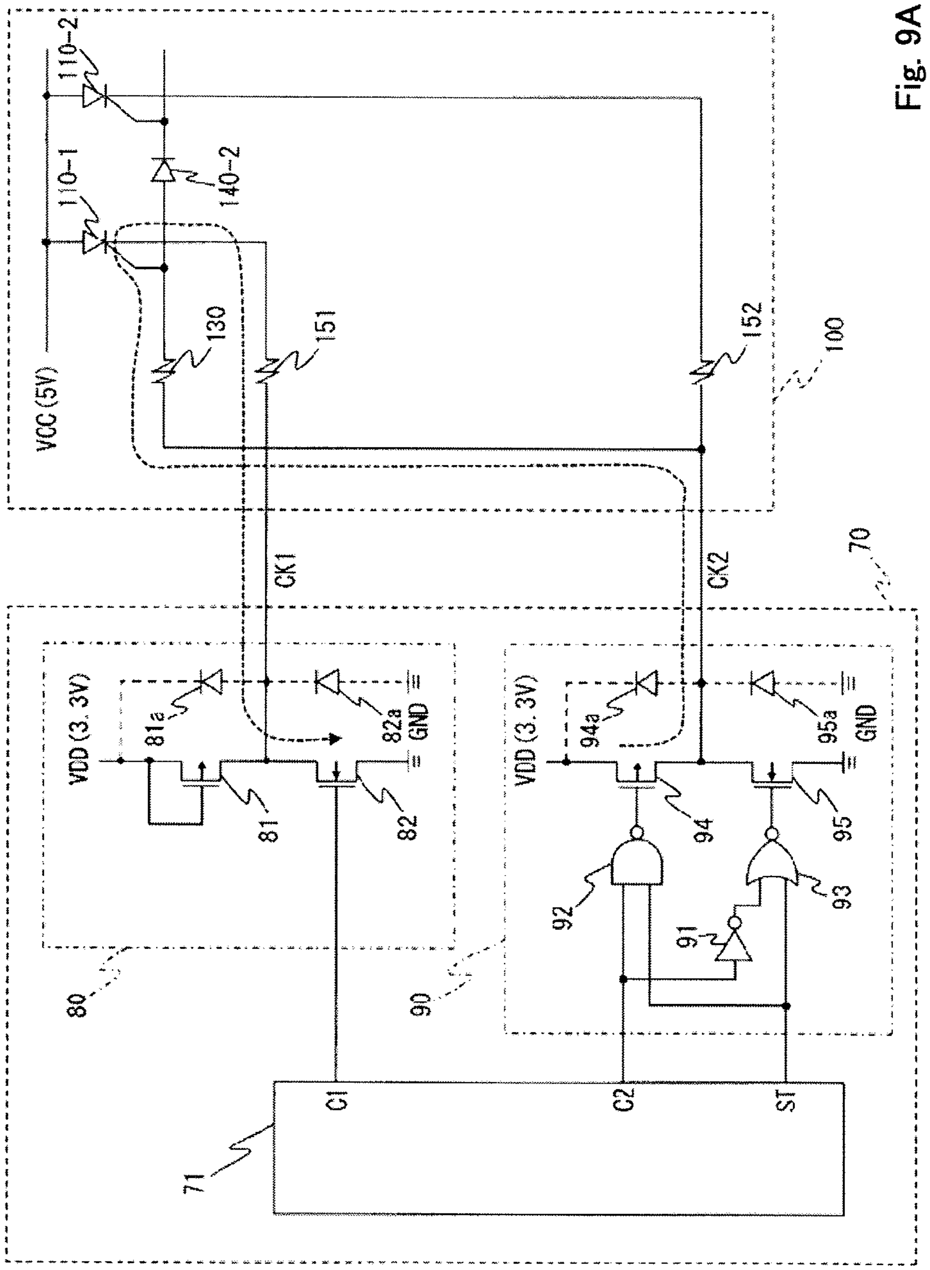
FIG. 9A is a circuit diagram of the main parts for explaining detailed operation of the print head shown in FIG. 1 at t2 in FIG. 8.

FIG. 9A is a circuit diagram of the main part for explaining detailed operation of the print head 13 shown in FIG. 1 at t2 in FIG. 8. In FIG. 9A, a diagram is shown that explains relationships between the scanning thyristors and peripheral circuits by extracting the scanning thyristors 110-1 and 110-2 as examples of the scanning thyristors in the scanning circuit 100.

In the clock driving circuit 70, the open-drain-type inverter 80 that is the first buffer includes a MOS transistor (e.g., PMOS 81) of a first conductive type that is connected between the VDD power source, which is the second power source, and the first clock terminal CK1, a second switching element (e.g., NMOS 82, which is a MOS transistor of a second conductive type that has a reverse polarity of the first conductive type) that is connected between the first clock terminal CK1 and ground GND and that performs on/off switching based on the second control signal C1, a second rectifying element (e.g., second diode 81*a*) that is connected in the opposite direction between the VDD power source and the first clock terminal CK1, and a rectifying element (e.g., diode 82*a*) that is connected in the opposite direction between the first clock terminal CK1 and ground GND.

Here, of the PMOS 81, the source and gate are connected to the VDD power source. The substrate thereof (not shown) is connected to the VDD power source. The drain thereof is connected to the first clock terminal CK1. The PMOS 81 is always in the OFF state. Of the NMOS 82, the drain is connected to the first clock terminal CK1. The second control signal C1 is inputted to the gate thereof The source thereof is connected to the ground GND. The diode 81*a* is a parasitic diode generated between the drain and substrate of the PMOS 81. The anode thereof is connected to the first clock terminal CK1, and the cathode thereof is connected to the VDD power source (3.3 V). In addition, the diode 82*a* is a parasitic diode generated between the drain and substrate of the NMOS 82.

The diode 81 a may be configured by general diode elements. In that case, the PMOS 81 may be omitted as it becomes unnecessary for the operation. In addition, the diode 82*a* is a parasitic diode generated by the NMOS 82 and is unnecessary for the operation.

The three-state-type output buffer 90, which is the second buffer, includes an inverter 91 that inverts the fourth control signal C2, a two-input negative AND circuit (hereinafter "NAND circuit") 92 that determines a negative AND logic of the fourth control signal C2 and the third control signal ST, a two-input negative OR circuit (hereinafter "NOR circuit") 93 that determines a negative OR logic of the output signal of the inverter 91 and the third control signal ST, a third switching element (e.g., PMOS 94) of the first conductive type that is connected between the VDD power source (3.3 V), which is the second power source, and the second clock terminal CK2 and that performs on/off switching based on the output signal of the NAND circuit 92, a fourth switching element (e.g., NMOS 95) of the second conductive type that is connected between the second clock terminal CK2 and ground GND and that performs on/off operation based on the output signal of the NOR circuit 93, a third rectifying element (e.g., third diode 94*a*) that is connected in the opposite direction between the VDD power source and the second clock terminal CK2, and a rectifying element (e.g., diode 95*a*) that is connected in the opposite direction between the second clock terminal CK2 and ground GND.

Here, of the PMOS 94, the source is connected to the VDD power source. The gate thereof is connected to the output terminal of the NAND circuit 92. The drain is connected to the second clock terminal CK2. Of the NMOS 95, the drain is connected to the second clock terminal CK2. The gate thereof is connected to the output terminal of the NOR circuit 93. The source thereof is connected to ground GND. The diode 94*a* is a parasitic diode generated between the drain and substrate of the PMOS 94. The anode thereof is connected to the second clock terminal CK2, and the cathode thereof is connected to the VDD power source (3.3 V). In addition, the diode 95*a* is a parasitic diode generated between the drain and substrate of the NMOS 95.

The diode 94*a* may be configured by general diode elements. In addition, the diode 95*a* is a parasitic diode generated by the NMOS 95 and is unnecessary for the operation.

With such a configuration, the open-drain-type inverter 80 performs operation similar to that of the open-drain-type inverter 62 shown in FIG. 1. On the other hand, the three-state-type output buffer 90 performs the following operation.

When the gates of the PMOS 94 and the NMOS 95 are both turned to the H level, the PMOS 94 is turned to the OFF state, and the NMOS 95 is turned to the ON state. Therefore, the clock terminal CK2 is turned to the L level. In contrast, when the gates of the PMOS 94 and the NMOS 95 are both turned to the L level, the PMOS 94 is turned to the ON state, and the NMOS 95 is turned to the OFF state. Therefore, the clock terminal CK2 is turned to the H level. In addition, when the gate of the PMOS 94 is turned to the H level and when the gate of the NMOS 95 is turned to the L level, the PMOS 94 and the NMOS 95 are both turned to the OFF state. Therefore, the clock terminal CK2 is turned to the Hi-Z output state.

As described above, the output buffer 90 is configured for not only the H and L levels but also the Hi-Z output state. These three output states are changed by generating gate signals at the PMOS 94 and the NMOS 95 as a result of the operations by the NAND circuit 92 and the NOR circuit 93 in response to the combination of the fourth control signal C2 and the third control signal ST that are inputted to the output buffer 90.

The broken line arrow shown in FIG. 9A indicates a current path in a state immediately after t2 in the timing chart shown in FIG. 8.

In this state, the control signal C1 is at the H level, and the NMOS 82 in the inverter 80 is in the ON state. Because the PMOS 81 is always in the OFF state, the clock terminal CK1 is at the L level. In addition, the control signals C2 and ST are at the H level. Therefore, the PMOS 94 is in the ON state, and the NMOS 95 is in the OFF state. Accordingly, the clock terminal CK2 is turned to the H level and is at an output potential approximately equivalent to the VDD power source (3.3 V).

As a result, the current flows in a path from the VDD power source (3.3 V) to ground GND through the PMOS 94, the clock terminal CK2 and the resistor 130, between the gate and cathode of the scanning thyristor 110-1, and through the resistor 151, the clock terminal CK1 and the NMSO 82. At this time, the forward voltage Vgk generated between the gate and cathode of the scanning thyristor 110-1 is approximately 1.6 V in a typical design example, which allows gate current sufficient to turn on the scanning thyristor 110-1 to be generated. As a result, the scanning thyristor 110-1 is turned on.

(4) Operation for Turning on the Second Stage Scanning Thyristor 110-2 (t5)

Figure 9B:
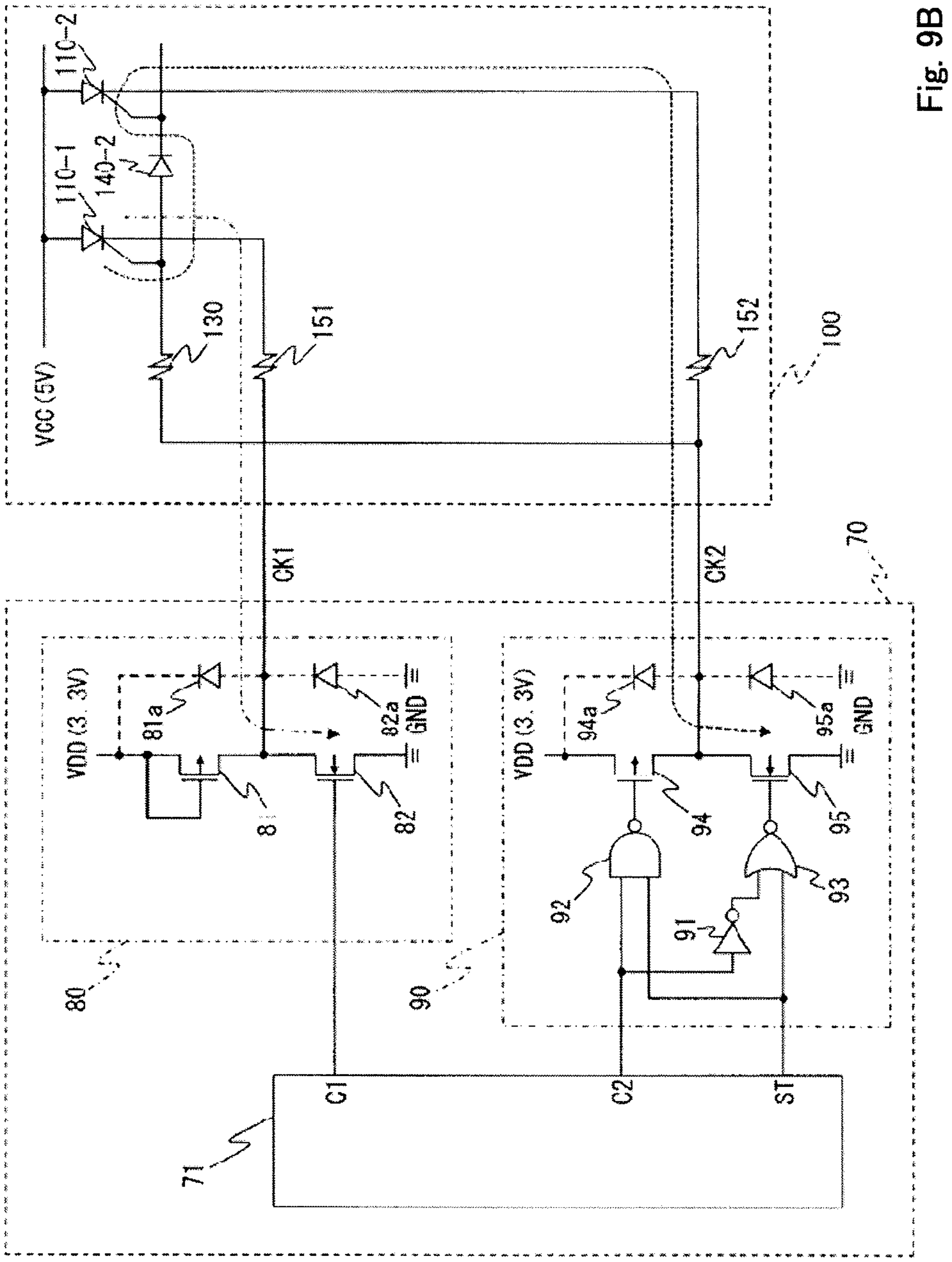
FIG. 9B is a circuit diagram of the main parts for explaining detailed operation of the print head shown in FIG. 1 at t5 in FIG. 8.

FIG. 9B is a circuit diagram of the main parts for explaining detailed operation of the print head 13 shown in FIG. 1 at t5 in FIG. 8. Elements common with the elements shown in FIG. 9A are indicted by the common symbols.

The block line arrow shown in FIG. 9B indicates a current path in a state immediately after t5 in the timing chart shown in FIG. 8.

In this state, the control signal C1 is at the H level, and the NMOS 82 is in the ON state. Because the PMOS 81 is always in the OFF state, the clock terminal CK1 is at the L level. In addition, the control signal C2 is at the H level, and the control signal ST falls to the L level at t4. As a result, the gate of the PMOS 94, to which the output signal of the NAND circuit 92 is inputted, is turned to the H level, and the PMOS 94 is turned to the OFF state.

At the same time, the gate of the NMOS 95, to which the output signal of the NOR circuit 93 is inputted, is turned to the H level, and the NMOS 95 is turned to the ON state. As a result, the clock terminal CK2 is turned to the L level as shown at part e in FIG. 8.

As explained using FIG. 9A, the scanning thyristor 110-1 is turned on immediately after t2. As indicated by a chain line arrow in FIG. 9B, the current is generated in the path from the VCC power source, between the anode and cathode of the scanning thyristor 110-1, through the resistor 151, the clock terminal CK1 and the NMOS 82 and to ground GND. At this time, the gate potential of the scanning thyristor 110-1 is approximately equivalent to the VCC power source (5 V). As the clock terminal CK2 is turned to the L level, the current is generated in the path through the gate of the scanning thyristor 110-1 and the diode 140-2, between the gate and cathode of the scanning thyristor 110-2, through the clock terminal CK2 and the NMOS 95 and to ground GND, as indicated by the broken line arrow in FIG. 9B.

To generate the current in the path of the broken line arrow, it is necessary that $$Vf+Vgk<VCC$$

where Vf is the forward voltage of the diode 140-2, and Vgk is the forward voltage between the gate and cathode of the scanning thyristor 110-2. In a typical example, Vf=1.6 V and Vgk=1.6 V. Therefore, when the VCC power source is 5 V, sufficient current value is secured in the path of the broken line arrow.

(5) OFF State of the First Stage Light Emitting Thyristor 210-1

Figure 9C:
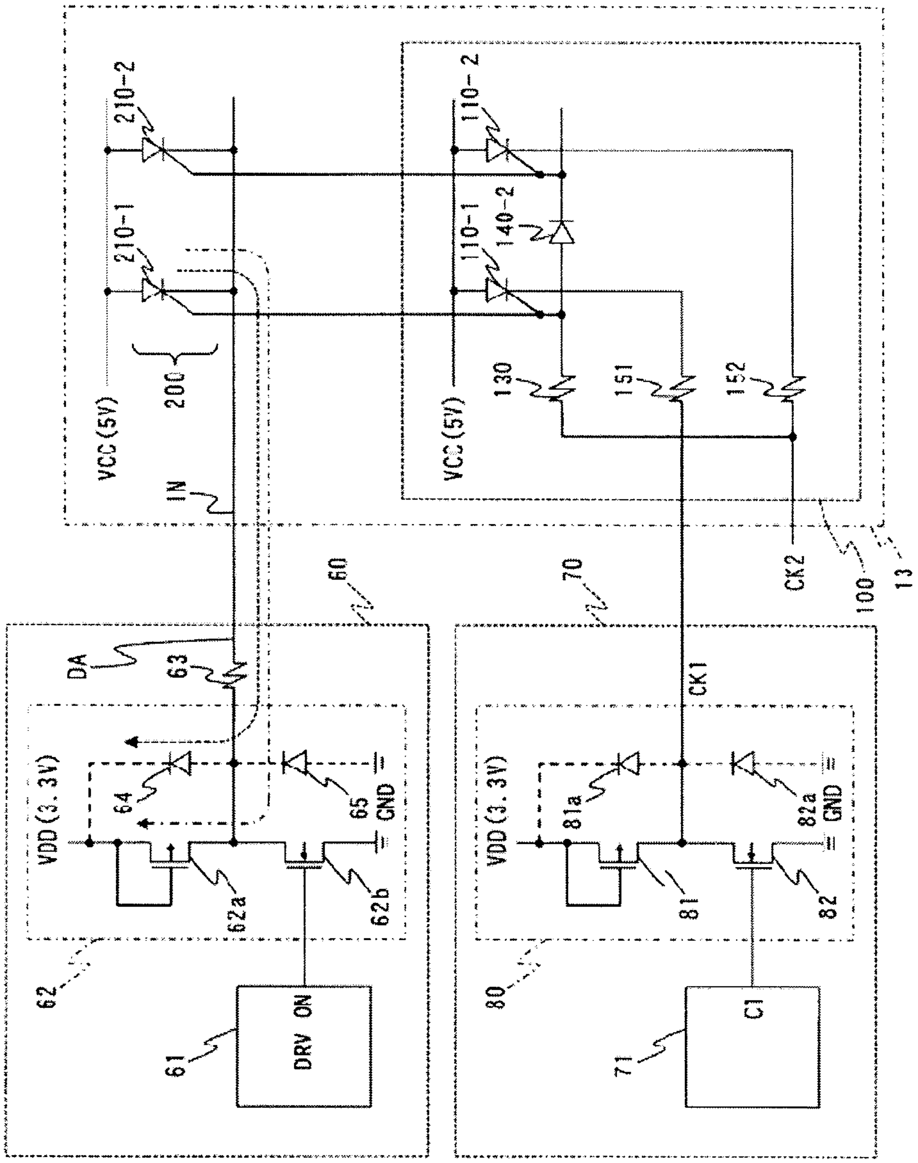
FIG. 9C is a circuit diagram of the main parts for explaining transition operation of the light emitting thyristors shown in FIG. 1 to the OFF state.

FIG. 9C is a circuit diagram of the main parts for explaining transition operation of the light emitting thyristors 210-1 shown in FIG. 1 to the OFF state. Elements common with the elements shown in FIGS. 9A and 9B are indicted by the common symbols.

FIG. 9C extracts and shows the scanning thyristors 110-1 and 110-2 in the scanning circuit 100 shown in FIG. 1, the light emitting thyristors 210-1 and 210-2 in the light emitting thyristor array 200 shown in FIG. 1, the data driving circuit 60, and the open-drain-type inverter 80 in the clock driving circuit 70 shown in FIG. 1. Using FIG. 9C, it is explained that the light emitting thyristor 210-1 can be securely turned off in an OFF command state for the light emitting thyristor 210-1.

The open-drain-type inverter 62 includes a MOS transistor (e.g., PMOS 62*a*) of a first conductive type that is connected between the VDD power source, which is the second power source, and the inverter output terminal, a first switching element (e.g., NMOS 62*b*, which is a MOS transistor of a second conductive type that has a reverse polarity of the first conductive type) that is connected between the inverter output terminal and ground GND and that performs on/off switching based on the first control signal DRV ON, a first rectifying element (e.g., first diode 64) (not shown in FIG. 1) that is connected in the opposite direction between the VDD power source and the inverter output terminal, and a rectifying element (e.g., diode 65) (not shown in FIG. 1) that is connected in the opposite direction between the inverter output terminal and ground GND.

Here, of the PMOS 62*a*, the source and gate are connected to the VDD power source. The substrate thereof (not shown) is connected to the VDD power source. The drain thereof is connected to the inverter output terminal. Therefore, the PMOS 62*a* is always in the OFF state. Of the NMOS 62*b*, the drain is connected to the inverter output terminal. The first control signal DRV ON is inputted to the gate thereof. The source thereof is connected to ground GND. The diode 64 is a parasitic diode generated between the drain and substrate of the PMOS 62*a*. The anode thereof is connected to the inverter output terminal, and the cathode thereof is connected to the VDD power source. In addition, the diode 65 is a parasitic diode generated between the drain and substrate of the NMOS 62*b*.

The diode 64 may be configured by general diode elements. In that case, the PMOS 62*a* may be omitted as it becomes unnecessary for the operation. In addition, the diode 65 is a parasitic diode generated by the NMOS 82*b* and is unnecessary for the operation.

For example, the VCC power source for the scanning circuit 100 and the light emitting thyristor array 200 is set to 5 V. The VDD power source for the data driving circuit 60 and the clock driving circuit 70 is set to 3.3 V.

The operation at the time of an OFF command for the light emitting thyristor is considered using FIG. 9C. This corresponds to a state after t3-t6 or the like and to a state prior to t2 in the timing chart shown in FIG. 8.

Because the inverter 62 of the data driving circuit 60 and the inverter 80 of the clock driving circuit 70 are of the same configuration, operation of the inverter 62 of the data driving circuit 60 and the light emitting thyristor 210-1 is considered as an example.

In the OFF command state of the light emitting thyristor 210-1, the control signal DRV ON is at the L level. Therefore, the NMOS 62*b* in the inverter 62 is in the OFF state. At this time, the gate of the PMOS 62*a* is connected to the VDD power source. Therefore, the PMOS 62*a* is in the OFF state.

In FIG. 9C, considering the current path indicated by the broken line arrow, the current is generated in the path from the VCC power source (5 V), between the anode and cathode of the light emitting thyristor 210-1, through the resistor 63 and the diode 64, and to the VDD power source 3.3 V. To cause the light emitting thyristor 210-1 to be turned on, it is necessary that $$\mathrm{Vak}+Vf<VCC-VDD \qquad (1)$$

to allow the current to flow in the path of the broken line arrow where Vak is the voltage between the anode and cathode of the light emitting thyristor 210-1 and Vf is the forward voltage of the diode 64 (in case of silicon Si). However, in the typical design example, Vak=1.6 V and Vf (Si)=0.6 V. Therefore, VCC−VDD=5V-3.3 V=1.7V. Therefore, the above-described Equation (1) is not satisfied. Accordingly, the current is not generated in the path of the broken line arrow.

As such, in the configuration shown in FIG. 9C (FIG. 1), when the print controller 40 sends the OFF command for the light emitting thyristors 210 and the scanning thyristors 110, the light emitting thyristor 210-1 to 2110-*n* and the scanning thyristors 110-1 to 110-*n* certainly maintain the OFF state.

The above-described configuration is resulted from the effect of configuring the inverter 62 of the open-drain type.

To ensure such configuration, as another configuration, a thought experiment is conducted for the operation of a CMOS push-pull-type inverter as the inverter 62.

The gate of the PMOS 62*a* is connected to the gate of the NMOS 62*a* to provide the inverter 62 with the CMOS push-pull configuration.

Similar to the above-described case, considering the case in which the control signal DRV ON is at the L level, the NMOS 62*b* is in the OFF state, and the gate of the PMOS 62*a* is at the L level. Therefore, the PMOS 62*a* is turned into the ON state. At this time, as indicated by the chain line arrow, the current flows in the path from the VCC power source (5 V), between the anode and cathode of the light emitting thyristor 210-1, through the resistor 63 and the PMOS 62*a*, and to the VDD power source (3.3 V).

At this time, the PMOS 62*a* is in the ON state, and the voltage between the drain and source thereof is negligibly small. Therefore, for the current to flow in the path of the chain line arrow, it is necessary that $$\mathrm{Vak}<\mathrm{VCC}-\mathrm{VDD} \qquad (2)$$

However, in the typical design example, Vak=1.6 V, and VCC−VDD=5V-3.3 V=1.7V. Therefore, the above-described Equation (2) is satisfied, and there is a possibility that the current is generated in the path of the chain line arrow. As a result, with the conventional data driving circuit as is, it is understood that, when the anode voltage (VCC) of the light emitting thyristors 210-1 to 210-*n* is 5 V, the cathode current of the light emitting thyristor 210 that has once turned into the ON State cannot be cut off, and as such, the secured OFF operation is not realized.

In contrast, according to the configuration shown in FIGS. 1 and 9C in the first embodiment, the PMOS 62*a* is in the OFF state, and the current path indicated by the chain line arrow shown in FIG. 9C is changed to the path of broken line. Therefore, as described above, the current does not flow in the path indicated by the broken line as a result of the forward voltage (approximately 0.6 V) of the diode 64.

(Advantages of First Embodiment) The following advantages (a) to (d) are achieved according to the first embodiment.

(a) For driving the scanning circuit including the conventional configuration, a CR differentiator circuit is provided on the output side of the clock driving circuit 70 shown in FIG. 1 to generate an undershoot waveform, and 2-phase clocks are outputted from the clock terminals CK1 and CK2. At this time, because a direct current component is not transmitted at the CR differentiator circuit, two output terminals are required for each of the clock terminals CK1 and CK2 (four output terminals in total); that is, two output terminals per transfer clock, or a total of four output terminals, are required.

In contrast, according to the first embodiment, with the circuit configuration shown in FIG. 1, the number of clock terminals for the clock driving circuit 70 is one for each transfer clock, which reduces the number of required terminals by half compared to the conventional configuration. Further, an external part, such as a capacitor, that is provided in the conventionally configured clock driving circuit is not necessary. As a result, not only an improvement of the data transfer speed in the print head 13 but also reduction of circuit size and cost due to the reduced number of clock terminals for the clock driving circuit 70 are realized.

(b) The open-drain-type inverters 62 and 80 are used as buffers for the VDD power source (e.g., 3.3 V) for driving data and clocks, and the VCC power source (e.g., 5 V) is used for the anode power source for the light emitting thyristor 210 and the scanning thyristor 110. As a result, when the light emitting thyristor 210 and the scanning thyristors 110 are in the OFF state, the light emitting thyristor 210 and the scanning thyristor 110 are not erroneously turned on because the PMOS parasitic diodes 64 and 81*a* that are provided in the inverts 60 and 80 exist in the current path thereof.

(c) The gate of the first stage scanning thyristor 110-1 and the second clock terminal CK2 are connected by the resistor 130. Therefore, the start signal is not needed. In addition, the data driving circuit 60 and the clock driving circuit 70 are operated by the VDD power source (e.g., 3.3 V) The open-drain-type inverters 62 and 80 are provided at the output part of the data driving circuit 60 and the clock driving circuit 70, respectively. The VCC power source (e.g., 5 V) is used as the anode power source for the light emitting thyristor 210 and the scanning thyristor 110. As a result, the print head can be driven with the VDD power source of 3.3 V, which is common as a power source voltage.

(d) According to the image forming device 1 of the first embodiment, the print head 13 is adapted. Therefore, a high quality image forming device 1, which has superior space and light extraction efficiencies, is provided. That is, by using the print head 13, advantages are achieved not only in the full color image forming device 1 as in the first embodiment but also in the monochrome and multicolor image forming devices. In particular, more advantages are achieved in the full color image forming device 1 that requires a large number of the print heads 13 as the exposure devices.

Second Embodiment

In the image forming device 1 in the second embodiment, the circuit configuration of the print head 13A is mainly different from that of the print head 13 in the first embodiment. The differences are described below.

Figure 10:
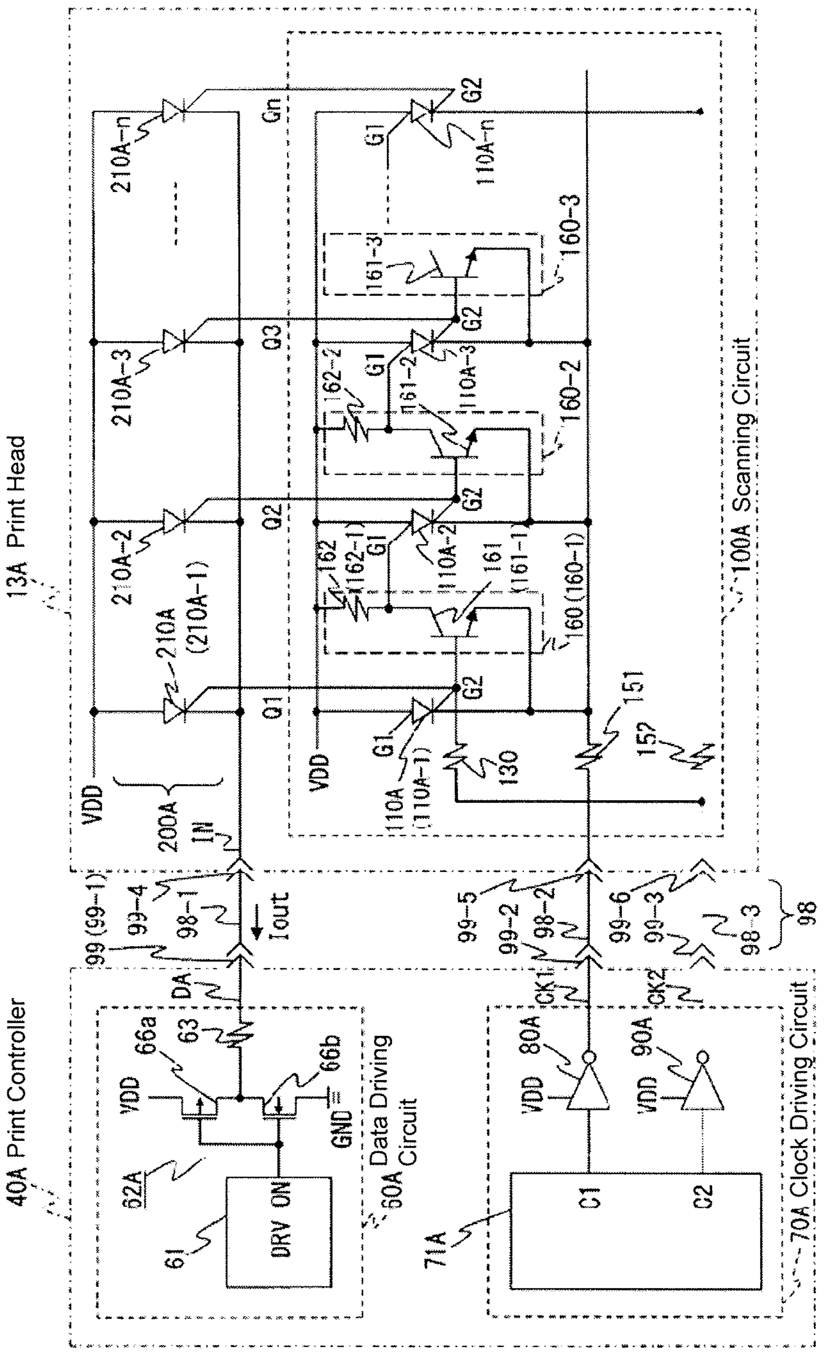
FIG. 10 is a circuit diagram that illustrates a configuration of a print head according to a second embodiment.

(Print Head in Second Embodiment) FIG. 10 is a circuit diagram illustrating a configuration of the print head 13A according to the second embodiment. The elements that are common with those in FIG. 1 showing the first embodiment are indicated by the same reference numerals.

The print head 13A in the second embodiment includes a scanning circuit 100A and light emitting thyristor arrays 200A which have different polarity from those for the self scanning circuit 100 and the light emitting thyristor arrays 200 in the first embodiment. The scanning circuit 100A and the light emitting thyristor arrays 200A are connected to the print controller 40A having a different configuration from that of the print controller 40 in the first embodiment, via the connection cable 98 (98-1 to 98-3) and a plurality of the connection connectors 99 (99-1 to 99-6), which are similar to those in the first embodiment. The scanning circuit 100A and the light emitting thyristor array 200A include a configuration to operate with the VDD power source (e.g., 3.3 V).

The print controller 40A includes a first driving circuit (e.g., data driving circuit) 60A and a second driving circuit (e.g., clock driving circuit) 70A that include configuration different from the data driving circuit 60 and the clock driving circuit 70, respectively, in the first embodiment. The data driving circuit 60A is a circuit that is operated by the VDD power source and that drives the common terminal IN on the light emission thyristor array 200A side at the H and L levels. The clock driving circuit 70A is a circuit that is operated by the VDD power source and that outputs the first and second clocks, which are 2-phase signals, for driving the scanning circuit 100A.

In the second embodiment, the driving system that drives the light emitting thyristor arrays 200A is similar to the that in the first embodiment and includes the scanning circuit 100A, the data driving circuit 60A and the clock driving circuit 70A. FIG. 10 illustrates an exemplary configuration in which the data driving circuit 60A and the clock driving circuit 70A are arranged inside the print controller 40. However, similar to FIG. 6 in the first embodiment, the data driving circuit 60A and the clock driving circuit 70A may be arranged in the print head 13A.

The light emitting thyristor arrays 200A, which are scanned by the scanning circuit 100A, include plural stages of P-gate light emitting thyristors 210A (210A-1 to 210A-*m*) as 3-terminal light emitting elements approximately the same as the first embodiment. For each of the light emitting thyristors 210A, the first terminal (e.g., anode) is connected to the VDD power source, the second terminal (e.g., cathode) is connected to the connection connector 99-4 via the common terminal IN through which the drive current Iout flows, and the first control terminal (e.g., gate) is connected to the respective output terminals Q1-Qm of the scanning circuits 100A. Similar to the first embodiment, the light emitting thyristors 210A-1 to 210A-*m* are divided into a plurality of groups of light emitting thyristors 210A-1 to 210A-*n*. Each group is separately and simultaneously driven in parallel by respective ones of the scanning circuits 100A. Similarly, the output terminals Q1-Qm are divided into a plurality of groups of output terminals Q1-Qn. Moreover, similar to the first embodiment, the total number of the light emitting thyristors 210A-1 to 210A-*m* (and output terminals Q1-Qm) is 4,992 with the print head 13A that is capable of printing an A4-size sheet at a resolution of 600 dots per inch. These light emitting thyristors form the array.

Each scanning circuit 100A is driven by the first and second clocks, which are 2-phase signals, supplied from the clock driving circuit 70A via the first and second clock terminals CK1 and CK2, the connection connectors 99-2 and 99-3, the connection cables 98-2 and 98-3, and the connection connectors 99-5 and 99-6. The scanning circuit 100A is a circuit that causes the light emitting thyristor arrays 200A to perform the ON/OFF operation by applying the trigger current thereto. The scanning circuit 100A includes plural stages of 4-terminal switching elements (e.g., 4-terminal scanning thyristors including N-gate and P-gate control terminals) 110A (110A-1 to 110A-*n*, e.g., n=192), and a first resistor 130 for start signals to which the second clock outputted from the second clock terminal CK2 is inputted, and plural stages of inverters 160 (160-1 to 160-(*n*-1) for determining the scanning direction. The scanning circuit 100A is configured from self scanning shift registers. The last stage inverter 160-*n* is not provided because the determination of the scanning direction is unnecessary.

The scanning thyristors 110A (110A-1 to 110A-*n*) at the respective stages include a third terminal (e.g., anode), a fourth terminal (e.g., cathode), a second control terminal (e.g., first gate G1) and a third control terminal (e.g., second gate G2). The anode is connected to the VDD power source. The second gate G3 is connected to the gate of the light emitting thyristor 210A of the corresponding stage via a corresponding one of the output terminals Q1-Qn.

The cathodes of the odd numbered stage scanning thyristors 110A-1, 110A-3, . . . , 110A-(*n*-1) are connected to the connection connector 99-5 via the resistor 151. The cathodes of the even numbered stage scanning thyristor 110A-2, 110A-4, . . . , 110A-*n*are connected to the connection connector 99-6 via the resistor 152. The second gate G2 of the first stage scanning thyristor 110A-1 is connected to the connection connector 99-6 via the resistor 130.

The first gate G1 and the second gate G2 of the first to last stage scanning thyristors 110A-1 to 110A-*n*are respectively connected via a forward-direction inverter 160 (160-1 to 160-(*n*-1)). That is, the second gate G2 of a previous stage scanning thyristor (e.g., 110A-1) and the first gate G1 of a subsequent stage scanning thyristor (e.g., 110A-2) are connected via a forward-direction inverter (e.g., 160-1).

The inverter 160 (160-1 to 160-(*n*-1)) of each stage is provided for determining the scanning direction (e.g., rightward direction in FIG. 10) at the time when the light emitting thyristors 210A-1 to 210A-*n*are sequentially turned on. Each inverter 160 is configured from an NPNTR 161 (161-1 to 161-(*n*-1)), which is a bipolar transistor, and a load resistor 162 (162-1 to 162-(*n*-1)) as a second resistor. In each inverter 160 (e.g., 160-1), the base of the NPNTR 161 (e.g., 161-1) is connected to the second gate G2 of the previous stage scanning thyristor 110A (e.g., 110A-1), the collector is connected to the VDD power source via the load resistor 162 (e.g., 162-1) and to the first gate G1 of the subsequent stage scanning thyristor 110A (e.g., 110A-2), and the emitter is connected to the cathode of the previous scanning thyristor 110A (e.g., 110A-1).

The scanning thyristor 110A of each stage includes a layer configuration similar to the light emitting thyristor 210A of each stage and perform similar circuit operations. However, because the scanning thyristor 110A does not require the light emission function similar to the light emitting thyristor 210, the upper surface of the scanning thyristors 110A is covered by a non-translucent material, such as a metal film, to block light.

In the scanning circuit 100A, the scanning thyristors 110A-1 to 110A-*n*are selectively turned to the ON state based on the first and second clocks, which are 2-phase signals, supplied from the first and second clock terminals CK1 and CK2 of the clock driving circuit 70A. The ON state is transmitted to the light emitting thyristor arrays 200A, to perform as an instruction to turn on the light emitting thyristors 210A-1 to 210A-*n*that are subject to emit light. In the scanning circuit 100A, the ON state of the scanning thyristor 110A at each stage that is turned to the ON state is transmitted to the adjacent scanning thyristor 110A for each of the first and second clocks, which are 2-phase signals, causing a circuit operation similar to a shift resistor.

There are the following differences in the scanning circuit 100A from the scanning circuit 100 in the first embodiment shown in FIG. 1.

In the scanning circuit 100 in the first embodiment, 3-terminal thyristors are used as the scanning thyristors 110 (110-1 to 110-*n*). The gates of the scanning thyristor 110 are respectively connected by the diodes 140.

The reason for using such a configuration is that, the gate functions as an input terminal in the process for turning on the scanning thyristor 110, and that the gate acts as an output terminal after the scanning thyristor 110 is turned on. Therefore, it is necessary to determine the transmission direction (e.g., rightward direction in FIG. 1) when each scanning thyristor 110 is sequentially turned on.

However, in the scanning circuit 110 in the first embodiment, an advantage to regulate the transmission speed is obtained by connecting the gates of the scanning thyristors 110 by the diodes 140. However, the forward voltages of the diode 140 and between the gate and cathode of the scanning thyristor 110 are both included in the path of the gate trigger current. Therefore, the additional value of the voltages become approximately equivalent to the power source voltage VDD. As a result, the gate trigger current is not generated with the commonly used VDD power source of 3.3 V.

To solve such an inconvenience, in the scanning circuit 100A in the second embodiment, by using 4-terminal scanning thyristors 110A in which additional gates are provided to the 3-terminal scanning thyristors 110 in the first embodiment, control signals of not only the positive logic but also the negative logic are received.

That is, the first gate G1 of the scanning thyristor 110A functions as a negative logic input terminal, and the second G2 functions as a positive logic data output terminal. The inverter 160 is configured from the NPNTR 161 and the load resistor 162. The positive logic data outputted from the second gate G2 of the previous stage scanning thyristor 110A is inverted, and the negative logic data is inputted to the first gate G1 of the subsequent stage scanning thyristor 110A. As a result, the transmission direction of the input and output signals of the inverter 160 is regulated in one direction. Therefore, the erroneous operation to transmit the signals in the opposite direction, that is, in a direction from the subsequent stage scanning thyristor 110A (e.g., 110A-2) to the previous stage scanning thyristor 110A (e.g., 110A-1), is prevented.

The plurality of data driving circuits 60A connected to the light emitting thyristor arrays 200A are circuits that generate a first control signal DRV ON, which is a drive command signal, approximately the same as the data driving circuit 60 of the first embodiment, and that causes the drive current Iout to flow to the common terminal IN as data for driving the plurality of light emitting thyristor arrays 200 by time division. The clock driving circuit 70A connected to the scanning circuit 100A is a circuit that generates second and fourth control signals C1 and C2 and that outputs the first and second clocks, which are 2-phase signals, to be supplied to the scanning circuit 100, unlike the clock driving circuit 70 of the first embodiment.

Similar to FIG. 1 for the first embodiment, to simplify the explanation, only one data driving circuit 60A is illustrated in FIG. 10. The plurality of light emitting thyristor arrays 200A includes a total of 4,992 light emitting thyristors 210A-1 to 210A-*m*, for example. The light emitting thyristors 210A are grouped by sets of light emitting thyristors 210A-1 to 210A-*n*. The groups of light emitting thyristors 210A-1 to 210A-*n*are separately driven simultaneously in parallel by the data driving circuits 60A respectively provided for each group.

Describing an example of typical design, 26 chips each including a light emitting thyristor array 200A, in which 192 light emitting thyristors 210A (210A-1 to 210A-*n*) are arrayed, are arranged on a printed wiring board 13*b* as shown in FIG. 4. As a result, the required 4,992 light emitting thyristors 210A-1 to 210A-m are formed on the print head 13A. At this time, the data driving circuits 60A are provided in correspondence with the 26 light emitting arrays 200A. Therefore, the total number of output terminals from the data driving circuits 60A is 26.

On the other hand, the clock driving circuit 70A drives the chip that includes the arrayed scanning circuits 100A. The clock driving circuit 70A is required for not only simply generating the clocks but also controlling the energy to turn on the below-discussed scanning thyristors 110A. To perform fast operation of the print head 13A, it is preferable to provide the clock driving circuit 70A for each scanning circuit 100A.

However, if the data transmission by the print head 13A can be slow, the clock terminals CK1 and CK2, which are the output terminals of the clock driving circuit 70A, and the plurality of scanning circuits 100A may be connected in parallel so that these circuits can be shared.

The data driving circuit 60A includes a data control circuit 61 that generates the control signal DRV ON similar to the first embodiment, an inverter 62A that inverts the control signal DRV ON dissimilar to the first embodiment, and a resistor 63 that is connected between the CMOS inverter 62A and the data terminal DA similar to the first embodiment.

The inverter 62A includes a first MOS transistor (e.g., PMOS 66*a*) of a first conductive type that performs the on/off operation by the control signal DRV ON and a MOS transistor (e.g., NMOS 66*b*) of a second conductive type that has a reverse polarity of the first conductive type and that performs the on/off switching by the control signal DRV ON. The PMOS 66*a* and the NMOS 66*b* are connected in series between the VDD power source (3.3 V) and ground GND. That is, of the PMOS 66*a*, the control signal DRV ON is inputted to the gate, the source is connected to the VDD power source, and the drain is connected to the drain of the NMOS 66*b* and one end of the resistor 63. Of the NMOS 66*b*, the control signal DRV ON is connected to the gate, and the source is connected to the ground GND.

For example, when the control signal DRV ON that is outputted from the data control circuit 61 is at the H level, the PMOS 66*a* and NMOS 66*b* are turned to the ON and OFF states, respectively, and the cathode of the light emitting thyristor 210A is turned to the H level via the resistor 63, the data terminal DA and the common terminal IN. Therefore, the drive current Iout that flows to the common terminal IN is turned to zero. As a result, all of the light emitting thyristors 210A-1 to 210A-*n*are turned to the non-light emission state.

In contrast, when the control signal DRV ON is at the H level, the PMOS 66*a* and NMOS 66*b* are turned to the OFF and ON states, respectively, and the cathode of the light emitting thyristor 210A is turned to the L level via the resistor 63, the data terminal DA and the common terminal IN. Therefore, the voltage that is approximately equivalent to the power source voltage VDD is applied between the anode and cathode of the light emitting thyristors 210A-1 to 210A-*n*. At this time, when an instruction is sent to one of the light emitting thyristors 210A-1 to 210A-*n*to emit light, the drive current Iout flows from the VDD power source to ground GND, between the anode and cathode of the light emitting thyristor 210A, via the common terminal IN, the resistor 63 and the NMOS 66*b*. As a result, the light emitting thyristor 210A is turned on.

The clock driving circuit 70A includes a clock control circuit 71A that generates the second and fourth control signals C1 and C2, an inverter 80A that is operated by the VDD power source and that inverts the second control signal C1 and outputs the first clock to the first clock terminal CK1, and an inverter 90A that is operated by the VDD power source and that inverts the fourth control signal C2 and outputs the second clock to the second clock terminal CK2.

Figure 11C:
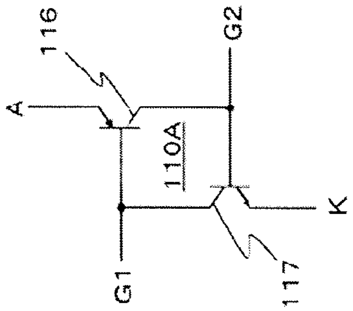
FIG. 11 is a block diagram illustrating the scanning thyristor shown in FIG. 10.
Figure 11B:
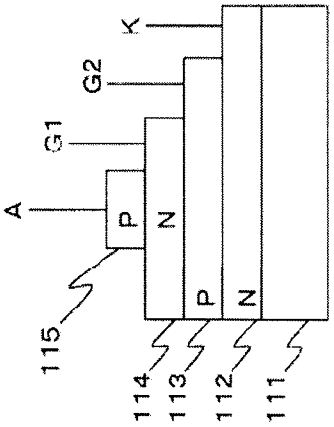
Figure 11A:
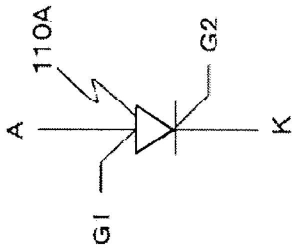

(Scanning Thyristor in Second Embodiment) FIGS. 11A-11C illustrate a configuration of a scanning thyristor 110A shown in FIG. 10.

FIG. 11A shows circuit symbols of the scanning thyristor 110A and includes an anode A, a cathode K and first and second gates G1 and G2.

FIG. 11B illustrates a cross-sectional configuration of the scanning thyristor 110A. The scanning thyristor 110A is fabricated, for example, by using a semi-insulating GaAs wafer substrate and by epitaxially growing predetermined crystals on the GaAs wafer substrate by a known MO-CVD method. The semi-insulating GaAs wafer substrate is a non-dope-type semiconductor that does not include impurities for providing conductivity and is an approximately insulating substrate with low conductivity.

That is, on the semi-insulating GaAs wafer substrate 111, a four-layer wafer with a PNPN configuration is formed by sequentially layering an N-type layer 112, a P-type layer 113, an N-type layer 114 and a P-type layer 115. In the N-type layer 112, an N-type impurity is contained in an AlGaAs material. The P-type layer 112 is formed to contain a P-type impurity. The N-type layer 114 is formed to contain an N-type impurity. The P-type layer 115 is formed to contain a P-type impurity. Moreover, using a known etching method, element isolation is performed by forming a trench. Next, a part of the P-type layer 115, which is the top layer, is exposed, and metal wiring is formed in the exposed region to form the anode A. In addition, by the etching process, a part of the N-type layer 114 is exposed, and metal wiring is formed in the exposed region to form the first gate G1. Similarly, by the etching process, a part of the P-type layer 113 is exposed, and metal wiring is formed in this region to form the second gate G2. Thereafter, the cathode K is formed by exposing a part of the N-type layer 112 by the etching process, and by forming metal wiring in this region.

FIG. 11C is a representative circuit schematic of the scanning thyristor 110A in contrast with FIG. 11B. The scanning thyristor 110A is configured from the PNPTR 116 and the NPNTR 117. The emitter of the PNPTR 116 corresponds to the anode A of the scanning thyristor 110A. The base of the PNPTR 116 corresponds to the first gate G1 of the scanning thyristor 110A. The base of the NPNTR 117 corresponds to the second gate G2 of the scanning thyristor 110A. The emitter of the NPNTR 117 corresponds to the cathode K of the scanning thyristor 110A. In addition, the collector of the PNPTR 116 is connected to the base of the NPNTR 117. The base of the PNPTR 116 is connected to the collector of the NPNTR 117.

The scanning thyristor 110A shown in FIGS. 11A-11C are configured by forming an AlGaAs layer on a GaAs wafer substrate. However, the scanning thyristor 110 is not limited to this configuration, but a material, such as GaP, GaAsP, AlGaInP and InGaAsP, may be used. In addition, the scanning thyristor 110 may be configured by forming a material, such as GaN, AlGaN, InGaN, InGaN or the like on a sapphire substrate.

Moreover, the scanning thyristor 110A shown in FIG. 11 corresponds to the scanning thyristors 110A-1 to 110A-*n*shown in FIG. 10. The configuration of the scanning thyristor 110A is the same as the configuration of the light emitting thyristor 210A (210A-1 to 210A-*n*) without the first gate G1 in FIG. 11. The difference between the scanning thyristor 110A and the light emitting thyristor 210A is the existence of the first gate G1. However, similar to the scanning thyristor 100A, the first gate G1 may be provided in the light emitting thyristor 210A. In that case, the unused first gate G1 may be kept open in the light emitting thyristor 210A.

Figure 12B:
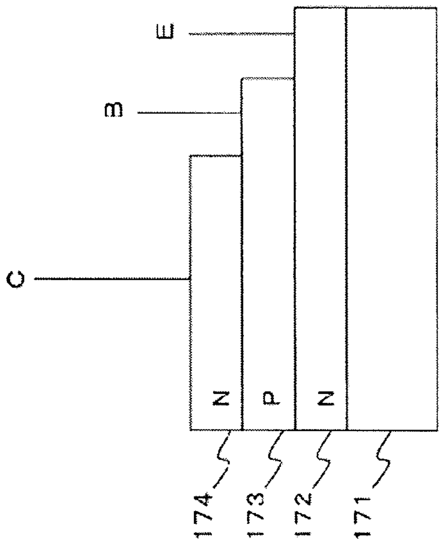
FIG. 12 is a block diagram illustrating the NPN transistor (NPNTR) shown in FIG. 10.
Figure 12A:
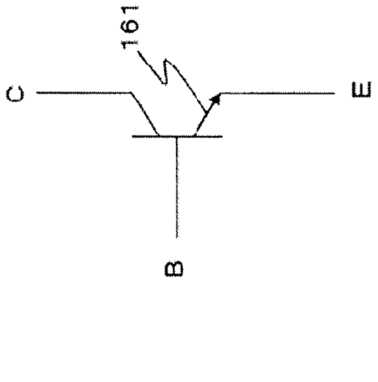

(NPNTR in First Embodiment) FIGS. 12A and 12B illustrate a configuration of the NPNTR 161 shown in FIG. 10.

FIG. 12A shows circuit symbols of the NPNTR 161 and includes an emitter E, a base B and a collector C.

FIG. 12B illustrates a cross-sectional configuration of the NPNTR 161. The NPNTR 161 is fabricated, for example, by using a semi-insulating GaAs wafer substrate and by epitaxially growing predetermined crystals on the GaAs wafer substrate 115*a* by a known MO-CVD method. The semi-insulating GaAs wafer substrate is a non-dope-type semiconductor that does not include impurities for providing conductivity and is an approximately insulating substrate with low conductivity. The NPNTR 161 is fabricated by using the process similar to that for the scanning thyristor 110A shown in FIG. 11.

For example, on the semi-insulating GaAs wafer substrate 171, a four-layer wafer with a PNPN configuration is formed by sequentially layering an N-type layer 172, a P-type layer 173, an N-type layer 174 and a P-type layer (not shown). In the N-type layer 172, an N-type impurity is contained in an AlGaAs material. The P-type layer 172 is formed to contain a P-type impurity. The N-type layer 174 is formed to contain an N-type impurity. The P-type layer (not shown) is formed to contain a P-type impurity. Moreover, using a known etching method, element isolation is performed by forming a trench. The P-type layer (not shown), which is the top layer, is removed by etching. Further, by the etching process, a part of the N-type layer 174 is exposed, and metal wiring is formed in the exposed region to form the collector C. Similarly, by the etching process, a part of the P-type layer 173 is exposed, and metal wiring is formed in this region to form the base B. Furthermore, the emitter E is formed by exposing a part of the N-type layer 172 by the etching process, and by forming metal wiring in this region.

The NPNTR 161 shown in FIGS. 12A and 12B are configured by forming an AlGaAs layer on a GaAs wafer substrate. However, the scanning thyristor 110 is not limited to this configuration, but a material, such as GaP, GaAsP, AlGaInP and InGaAsP, may be used. In addition, the NPNTR 161 may be configured by forming a material, such as GaN, AlGaN, InGaN, InGaN or the like on a sapphire substrate.

(Schematic Operation of Print Head in Second Embodiment) In FIG. 10, considering the operation of the light emitting thyristor 210A (210A-1 to 210A-*n*), taking into account the scanning thyristor 110A that is in the ON state among the scanning thyristors 110A-1 to 110A-*n*, the anode of the light emitting thyristor 210A is connected to the VDD power source. When the cathode is turned to the L level, the voltage is applied between the anode and cathode of the light emitting thyristor 210A. In the meantime, because the gate of the light emitting thyristor 210A (210A-1 to 210A-*n*) and the second gate G2 of the scanning thyristor 110A (110A-1 to 110A-*n*) are connected to each other, the second gate G2 of the scanning thyristor 110A that is in the ON state among the scanning thyristors 110A-1 to 110A-*n*is turned to the H level. Therefore, the voltage is applied between the gate and cathode of the light emitting thyristor 210A connected to the second gate G2 of the scanning thyristor 110A.

As a result, trigger current is generated at the gate of the light emitting thyristor 210A, and the light emitting thyristor 210A that is instructed to emit light is turned on. At this time, the current that flows to the cathode of the light emitting thyristors is the drive current Iout that flows in from the data terminal DA. Therefore, the light emitting thyristor 210A is turned to the light emission state, and an optical output is generated in response to the value of the drive current Iout.

Figure 13:
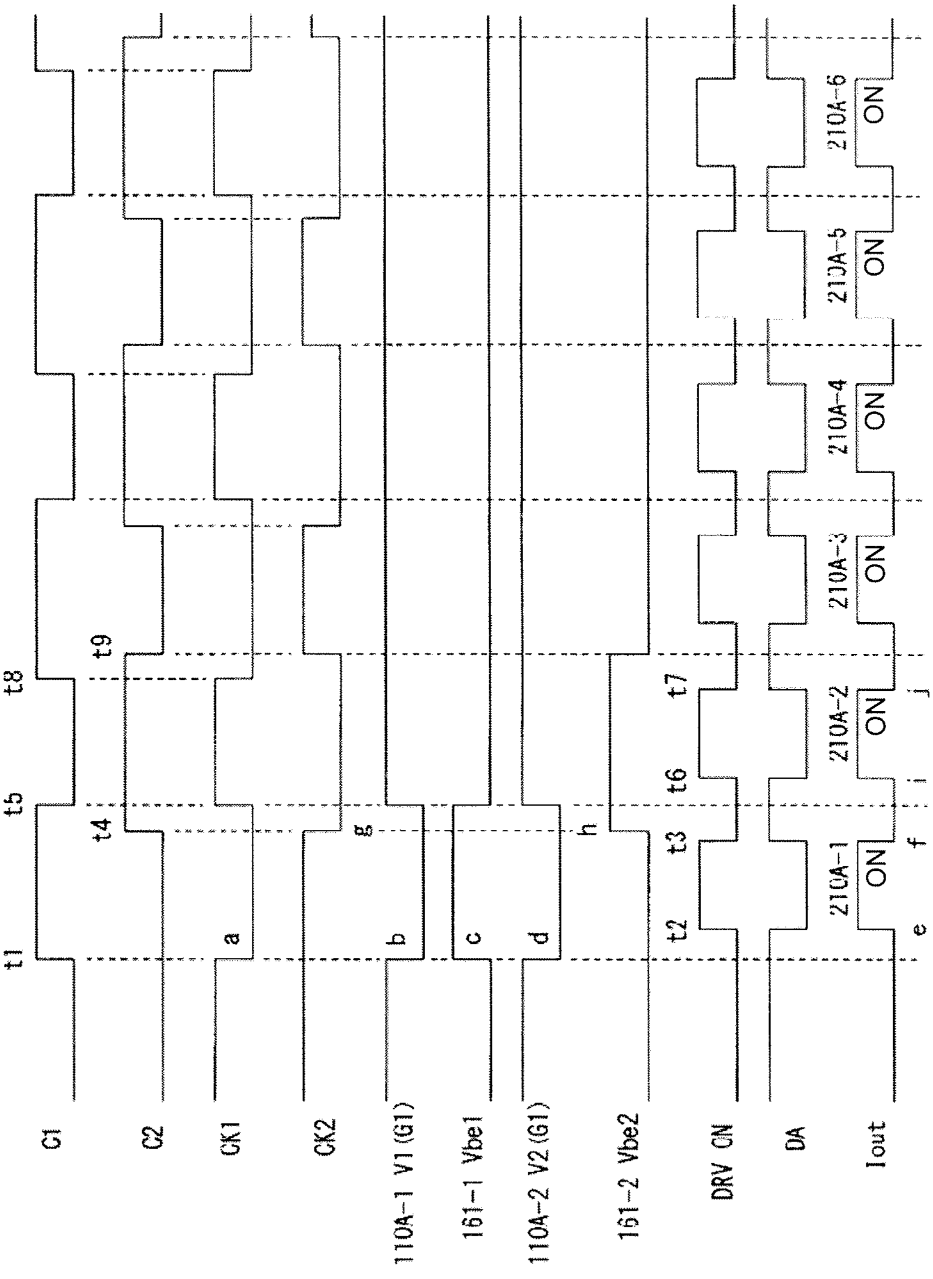
FIG. 13 is a timing chart that illustrates operation of the circuit shown in FIG. 10.

(Detailed Operation of Print Head in Second Embodiment) FIG. 13 is a timing chart that illustrates a detailed operation of the print head 13A shown in FIG. 10.

Similar to FIG. 8 for the first embodiment, FIG. 13 shows operational waveforms during a case in which the light emitting thyristors 210A-1 to 210A-*n*(e.g., n=6) shown in FIG. 10 are sequentially turned on in a single line scanning during the print operation in the image forming device 1 shown in FIG. 2.

In the timing chart shown in FIG. 13, the control signals C1 and C2 outputted from the clock control circuit 71A are at the L level. The logic of the control signals C1 and C2 is inverted respectively by the inverters 80A and 90A, and the first and second clocks outputted respectively from the first and second clock terminals CK1 and CK2 are turned to the H level. As a result, the voltage between the anode and cathode of the set of the odd numbered stage scanning thyristors 110A-1, 110A-3, . . . and the voltage between the anode and cathode of the set of the even numbered stage scanning thyristors 110A-2, 110A-4, . . . are turned approximately zero. Therefore, all of the scanning thyristors 110A-1 to 110A-*n*in the scanning circuit 100 are turned to the OFF state.

In addition, the control signal DRV ON outputted from the data control circuit 61 is at the L level. The control signal DRV ON is inverted by the inverter 62A, and the data terminal DA is turned to the H level via the resistor 63. As a result, the voltage between the anode and cathode of the light emitting thyristors 210A-1 to 210A-*n*is also turned to approximately zero via the common terminal IN. Therefore, the light emitting thyristors 210-1A to 210A-*n*are also turned to the OFF state.

The below description explains (1) a process for turning on the first stage scanning thyristor 110A-1 and (2) a process for turning on the second stage scanning thyristor 110A-2.

(1) Process for Turning on the First Stage Scanning Thyristor 110A-1

At t1, the control signal C1 rises to the H level. The H level signal is inverted by the inverter 80A, and the clock terminal CK1 falls to the L level as shown at part a in FIG. 13. In the meantime, the control signal C2 is at the L level. The L level signal is inverted by the inverter 90A, and the clock terminal CK2 is at the H level. Therefore, current flows from the clock terminal CK2, which is at the H level, through the resistor, between the second gate G2 and cathode of the scanning thyristor 110A-1, through the resistor 151 and to the clock terminal CK1, which is at the L level. As a result, the scanning thyristor 110A-1 is turned to the ON state.

In a typical design example, when the scanning thyristor 110A-1 is to be turned on, the voltage between the second gate G2 and cathode is approximately 1.6 V. In addition, the power source voltage VDD of the inverters 80A and 90A in the clock driving circuit 70A is 3.3 V. Therefore, the H level voltage of the clock terminal CK2 and the power source voltage VDD are approximately equal to each other. As such, the voltages are of a value sufficient to cause the gate current to be generated at the scanning thyristor 110A-1.

With the turning on of the scanning thyristor 110A-1, a voltage V1 (G1) of the first gate G1 of the scanning thyristor 110A-1 is turned to the L level as shown at part b. More specifically, the potential of the voltage V1 (G1) is approximately equivalent to the cathode potential of the scanning thyristor 110A-1 and is higher by an amount of the potential at both ends of the resistor 151.

As described above, when the scanning thyristor 110A-1 is turned on and the voltage is generated between the gate and cathode of the scanning thyristor 110A-1, a base-emitter voltage Vbe1 is generated between the base and emitter of the NPNTR 161-1 connected to the second gate G2 of the scanning thyristor 110A-1. The waveform of the base-emitter voltage Vbe1 rises to the H level as shown at part c, and thereby the NPNTR 161-1 is also turned to the ON state. At this time, because the collector of the NPNTR 161 is connected to the first gate G1 of the scanning thyristor 110A-2, the voltage V2 (G1) of the first gate G1 of the scanning thyristor 110A-2 falls to the L level as shown at part d.

At t2, the control signal DRV ON rises to the H level. The H level signal is inverted by the inverter 62A, and the data terminal DA is turned to the L level via the resistor 63. At this time, because the scanning thyristor 110A-1 is in the ON state, the potential of the second gate G2 of the scanning thyristor 110A-1 is at the H level. Therefore, current is generated at the gate terminal of the light emitting thyristor 210A-1 that shares the gate potential with the scanning thyristor 110A-1, and thus, the light emitting thyristor 210A-1 is turned on. As a result, the drive current lout is generated at the cathode of the light emitting thyristor 210A-1 as shown at part e. Accordingly, a light emission output is generated in response to the value of the drive current Iout.

At t3, the control signal DRV ON falls to the L level. The L level signal is inverted by the inverter 62A, and the data terminal DA is turned to the H level via the resistor 63. Therefore, the voltage between the anode and cathode of the light emitting thyristor 210A-1 is turned to approximately zero. As a result, the light emitting thyristor 210A-1 is turned off, and the drive current Iout is turned to approximately zero as shown at part f.

In the second embodiment, a latent image is formed on the photosensitive drum 11 shown in FIG. 2 by causing the light emitting thyristor 210A-1 to emit light. The amount of exposure energy at this time is a product of the light emission power based on the value of the drive current Iout and the exposure time (=t3−t2). Therefore, even if there is a difference in luminous efficiency originated from the fluctuations in manufacturing the light emitting thyristor 210A-1 and the like, the fluctuations in the amount of exposure energy may be corrected by adjusting the exposure time for each light emitting thyristor 210A.

In addition, when the light emission by the light emitting thyristor 210A-1 is not necessary, the control signal DRV ON is maintained at the L level between t2 and t3. Therefore, the light emission by the light emitting thyristor 210A may be controlled by the control signal DRV ON.

(2) Process for Turning on Second Stage Scanning Thyristor 110A-2

At t4, the control signal C2 rises to the H level. The H level signal is inverted by the inverter 90A, and the second clock outputted from the second clock terminal CK2 falls to the L level as shown at part g. At this time, both of the scanning thyristor 110A-1 and the NPNTR 161-1 is in the ON state, and the collector potential of the NPNTR 161-1, that is, the voltage V2 (G1) of the first gate G1 of the scanning thyristor 110A-2, is at the L level.

As described above, as the clock terminal CK2 is turned to the L level immediately after t4, a voltage is generated between the anode and first gate G1 of the scanning thyristor 110A-2. Therefore, the scanning thyristor 110A-2 is turned on. Accordingly, a voltage is generated between the second gate G2 and cathode of the scanning thyristor 110A-2, and the voltage Vbe2 between the base and emitter of the NPNTR 161-2 rises to the H level. Therefore, the NPNTR 161-2 is turned on.

At t5, the control signal C1 falls to the L level. The L level signal is inverted by the inverter 80A, and the first clock terminal CK1 rises to the H level. As a result, the voltage between the anode and cathode of the scanning thyristor 110A-1 is turned to approximately zero, and the scanning thyristor 110A-1 is turned off.

AT t6, the control signal DRV ON rises to the H level. The H level signal is inverted by the inverter 64A, and the data terminal DA is turned to the L level via the resistor 63. As described above, the scanning thyristor 110A-2 is in the ON state at t6, and thus the scanning thyristor 110A-1 is in the OFF state. Therefore, because the scanning thyristor 110A-2 is in the ON state, the light emitting thyristor 210A-2 that shares the gate potential with the second gate G2 of the scanning thyristor 110A-2 is turned on, and the drive current Iout is generated at the cathode of the light emitting thyristor 210A-2 as shown at part i. As result, an optical output is generated in response to the value of the drive current Iout.

At t7, the control signal DRV ON falls to the L level. The L level signal is inverted by the inverter 62A, and the data terminal DA is turned to the H level. As a result, the light emitting thyristors 210A-2 is turned off, and the drive current Iout is turned to approximately zero as shown at part j.

At t8, the control signal C1 rises to the H level. The H level signal is inverted by the inverter 80A, and the first clock terminal CK1 is turned to the L level. At this time, the scanning thyristor 110A-2 is in the ON state, and the NPNTR 161-2 is also in the ON state. Therefore, a voltage is generated between the anode and first gate G1 of the scanning thyristor 110A-3. As a result, the scanning thyristor 110A-3 is turned on.

Thereafter, at t9, the control signal C2 falls to the L level. The L level signal is inverted by the inverter 90A, and the second clock terminal CK2 is turned to the H level. As a result, the scanning thyristor 110A-2 is turned off.

Similarly, the transition of the control signals C1 and C2 and the turning on and off of the control signal DRV ON sequentially occur, and thereby the light emitting thyristors 210A-3 to 210A-*n*are sequentially turned on.

(Advantages of Second Embodiment) According to the second embodiment, there are advantages that similar to (a) to (d) of the first embodiment. Additionally, there is the following advantage (e).

(e) The scanning thyristor 110A (110A-1 to 110A-*n*) is configured from a 4-terminal thyristor including N-gate and P-gate control terminals, and the inverter 160 (160-1 to 160-*n*) that includes the NPNTR 161 (161-1 to 161-*n*) and the load resistor 162 (162-1 to 162-*n*) exists between the gates of the 4-terminal thyristors. The inverter 160 provides directionality in the signal transmission. Therefore, erroneous operation of the scanning circuit 100A is prevented. Additionally, because the on voltage of the inverter 160 is small, the inverter 160 can be operated at the VDD power source (e.g., 3.3 V), resulting in power saving.

(Exemplary Modifications of First and Second Embodiments) The present embodiment is not limited to the above-described first and second embodiments. Rather, various usages and/or modifications are possible. The following (I) and (II) are examples of such various usages and/or modifications.

(I) In the first and second embodiments, cases are discussed in which the first and second embodiments and their respective first and second exemplary modifications are applied to the light emitting thyristors 210 and 210A that are used as light sources. However, the first and second embodiments and their respective first and second exemplary modifications may be applied in a case in which, using the thyristors as switching elements, a voltage application control is performed on other elements (e.g., organic electroluminescent elements (hereinafter "organic EL elements") that are serially connected to the switching elements, for example. For instance, the first and second embodiments and their respective first and second exemplary modifications may be used in a printer that includes an organic EL print head configured by organic EL element arrays, a display device including display element arrays, and the like.

(II) The first and second embodiments may be applied to thyristors that may be used as switching elements for driving (i.e., controlling application of voltage to) display elements (display elements that are arranged in arrays or matrices).

What is claimed is:

1. A driving device that drives a light emitting thyristor array including plural stages of light emitting thyristors, the plural stages of light emitting thyristors each including a first terminal, a second terminal, and a first control terminal that controls on and off switching between the first and second terminals, the first terminal being commonly connected to a first power source and the second terminal being commonly connected to a common terminal, the driving device comprising:

a first driving circuit that is operated by a second power source and that drives the common terminal at high and low logic levels;

a scanning circuit that includes plural stages of scanning thyristors and that sequentially scans the plural stages of light emitting thyristors, the plural stages of scanning thyristors each including a third terminal, a fourth terminal, and a second control terminal that controls on and off switching between the third and fourth terminals, the third terminal being commonly connected to the first power source, the second control terminal of each stage being connected to the first control terminal of a light emitting thyristor of a corresponding stage; and a second driving circuit that is operated by the second power source, that generates first and second clock signals for driving the scanning circuit, and that outputs the first and second clock signals from first and second clock terminals, respectively, wherein the fourth terminal of an odd numbered stage scanning thyristor is commonly connected to the first clock terminal, the fourth terminal of an even numbered stage scanning thyristor is commonly connected to the second clock terminal, and the second control terminal of a first stage scanning thyristor is connected to the second clock terminal via a first resistor.

2. The driving device of claim 1, wherein the first driving circuit includes a first switching element that is connected between the common terminal and ground and that switches on and off based on a first control signal, and a first rectifying element that is connected in an opposite direction of current flow in the first driving circuit between the second power source and the common terminal.

3. The driving device of claim 2, wherein the first switching element is a MOS transistor, and the first rectifying element is a first diode.

4. The driving device of claim 3, wherein the first rectifying element is a first parasitic diode formed by a first MOS transistor of a first conductive type, and the first switching element is a second MOS transistor of a second conductive type that has a reverse polarity of the first conductive type.

5. The driving device of claim 1, wherein the second control terminal of a previous stage scanning thyristor is connected to the second control terminal of a subsequent stage scanning thyristor via a diode in a forward direction, the second control terminals of second to last stage scanning thyristors are respectively connected to ground via second resistors, and the second driving circuit includes a first buffer of an open-drain type that is operated by the second power source and that outputs the first clock signal to the first clock terminal by driving the second control signal, and a second buffer of a three-state type that is operated by the second power source and that outputs the second clock signal to the second clock terminal by driving a third control signal, the second buffer being configurable in a high impedance output state.

6. The driving device of claim 5, wherein the first buffer includes:

a second switching element that is connected between the first clock terminal and ground and that switches on and off based on the second control signal; and a second rectifying element that is connected in an opposite direction of current flow in the first buffer between the second power source and the first clock terminal, and the second buffer includes:

a third switching element of the first conductive type that is connected between the second power source and the second clock terminal, that switches on and off based on the third control signal, and that is turned to an OFF state by a fourth control signal;

a fourth switching element of the second conductive type that is connected between the second power source and ground, that switches on and off based on the third control signal, and that is turned to an OFF state by the fourth control signal; and a third rectifying element that is connected in an opposite direction of current flow in the second buffer between the second power source and the second clock terminal.

7. The driving device of claim 6, wherein the second, third and fourth switching elements are MOS transistors, and the second and third rectifying elements are second and third diodes.

8. The driving device of claim 6, wherein each of the second and third rectifying elements is a parasitic diode formed by a MOS transistor of the first conductive type, each of the second and fourth switching elements is a MOS transistor of the second conductive type, and the third switching element is a MOS transistor of the first conductive type.

9. The driving device of claim 1, wherein the first power source outputs a higher power source voltage than the second power source.

10. A print head, comprising:

the light emitting thyristor array of claim 1; and the driving device of claim 1.

11. An image forming device, comprising:

the print head of claim 10, wherein an image is formed on a recording medium by exposure by the print head.

12. The driving device of claim 1, wherein each of the plural stages of scanning thyristors includes a third control terminal that controls on and off switching between the third and fourth terminals, and the second control terminal of a previous stage scanning thyristor is connected to the third control terminal of a subsequent stage scanning thyristor via a forward direction inverter.

13. The driving device of claim 12, wherein the forward direction inverter includes a transistor that switches on and off based on the signal of the second control terminal of the previous stage scanning thyristor, and a second resistor, the transistor and the second resistor are connected in series between the first power source and the fourth terminal of the previous stage scanning thyristor, and a connection point of the transistor and the second resistor is connected to the third control terminal of the subsequent stage scanning thyristor.

* * * * *